United States Patent
Tao et al.

(10) Patent No.: US 9,793,923 B2
(45) Date of Patent: Oct. 17, 2017

(54) LDPC POST-PROCESSOR ARCHITECTURE AND METHOD FOR LOW ERROR FLOOR CONDITIONS

(71) Applicant: Texas Instruments Incorporated, Dallas, TX (US)

(72) Inventors: Yaoyu Tao, Stanford, CA (US); Joyce Kwong, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/950,659

(22) Filed: Nov. 24, 2015

(65) Prior Publication Data

US 2017/0149446 A1    May 25, 2017

(51) Int. Cl.
*H04L 1/00* (2006.01)
*H03M 13/11* (2006.01)

(52) U.S. Cl.
CPC .... *H03M 13/1117* (2013.01); *H03M 13/1108* (2013.01); *H03M 13/1142* (2013.01)

(58) Field of Classification Search
CPC .................................................... H04L 1/0009
USPC ........................................ 714/774, 776, 788
See application file for complete search history.

(56) References Cited

U.S. PATENT DOCUMENTS

| | | | |
|---|---|---|---|
| 8,219,878 B1 * | 7/2012 | Varnica | H03M 13/1111 714/758 |
| 8,307,255 B2 | 11/2012 | Sun et al. | |
| 8,484,531 B1 | 7/2013 | Varnica et al. | |
| 2012/0054576 A1 * | 3/2012 | Gross | H03M 13/1117 714/752 |
| 2012/0221914 A1 * | 8/2012 | Morero | H03M 13/015 714/752 |
| 2013/0061112 A1 | 3/2013 | Chen et al. | |

(Continued)

OTHER PUBLICATIONS

"An Efficient 10GBASE-T Ethernet LDPC Decoder Design With Low Error Floors", Zhengya Zhang et al., IEEE Journal of Solid State Circuits, vol. 45, No. 4, Apr. 2010, pp. 843-855.

(Continued)

*Primary Examiner* — Fritz Alphonse
(74) *Attorney, Agent, or Firm* — John R. Pessetto; Charles A. Brill; Frank D. Cimino

(57) ABSTRACT

Post-processing circuitry for LDPC decoding includes check node processor for processing shifted LLR values, a hard decision decoder circuitry for receiving processed LLR information and performing parity checks on the processed LLR information. Post-processing control circuitry controls updating of LLR information in the check node processor. The check node processor, hard decision decoder, and control circuitry cooperate to identify check nodes with unsatisfied parity checks after an iteration cycle, identify neighborhood variable nodes that are connected with unsatisfied check nodes, identify satisfied check nodes which are connected to neighborhood variable nodes, and modify messages from neighborhood variable nodes to satisfied check nodes if needed to introduce perturbations to resolve decoding errors. Neighborhood identification circuitry determines which variable nodes are connected with unsatisfied check nodes, that have failed a parity check, and produces a signal indicating which variable nodes are connected to unsatisfied check nodes.

11 Claims, 8 Drawing Sheets

(56) References Cited

U.S. PATENT DOCUMENTS

2013/0294782 A1* 11/2013 Liboiron-Ladouceur H04B 10/616
398/202
2014/0122960 A1* 5/2014 Aliseychik ......... H03M 13/1142
714/752

OTHER PUBLICATIONS

"Lowering LDPC Error Floors by Postprocessing", Zhengya Zhang et al., IEEE"GLOBECOM", 2008, pp. 1-6.
International Search Report in corresponding PCT Application No. PCT/US2016/063619, dated Feb. 27, 2017 (2 pages).

* cited by examiner

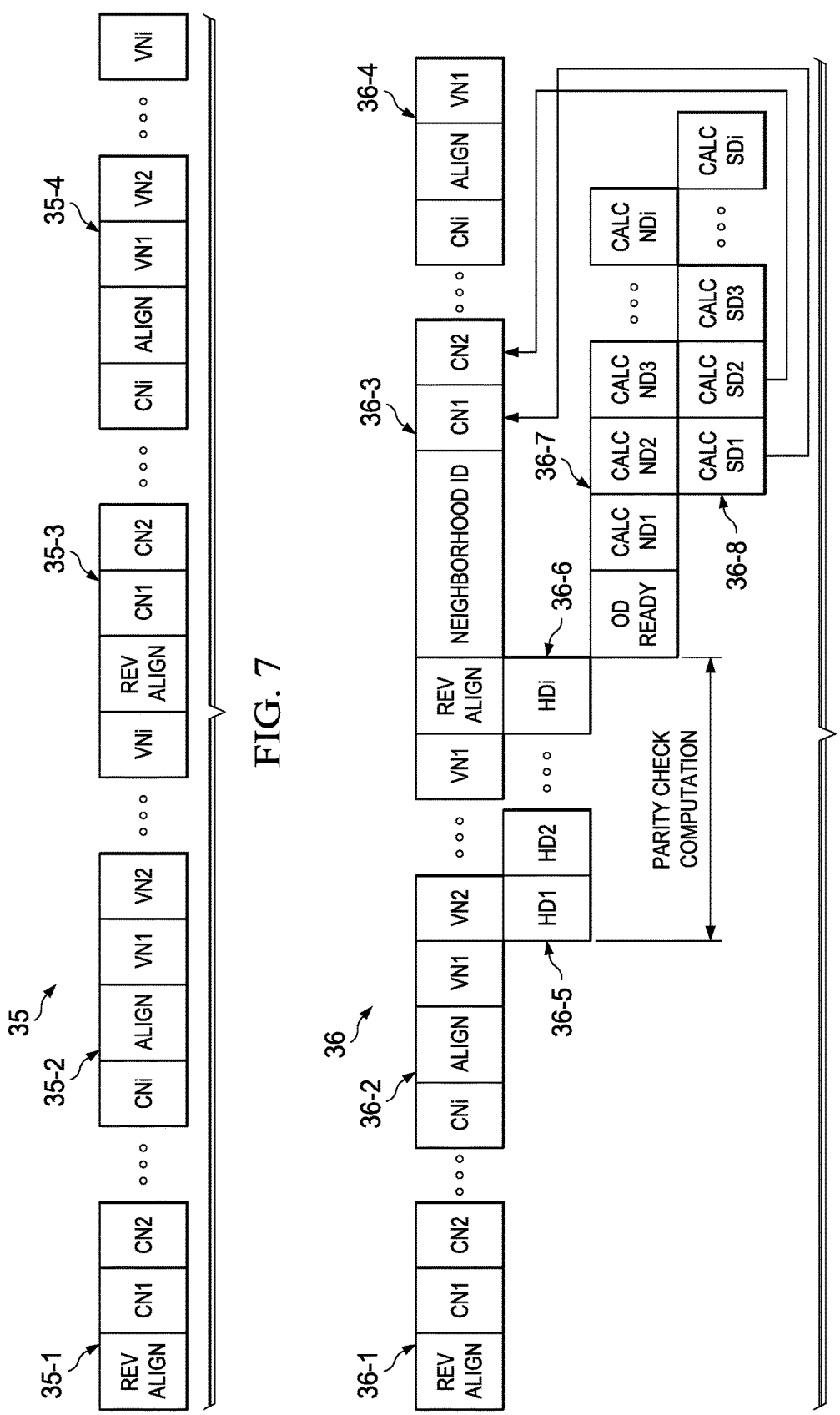

LDPC POST-PROCESSOR ARCHITECTURE AND METHOD FOR LOW ERROR FLOOR CONDITIONS

BACKGROUND OF THE INVENTION

The present invention relates generally to hardware and software additions to an LDPC (Low Density Parity Check) decoder to implement a post-processing algorithm, and more particularly to additions which inject noise into the decoder to help it converge to a valid codeword and thereby lower the error floor.

Some Low Density Parity Check (LDPC) codes show an "error floor", which is a reduction in the slope of the BER (Bit Error Rate) vs. channel SNR (signal-to-noise) curve, at low BER levels. This implies that the bit error rate at a given signal-to-noise ratio is higher than expected. This is undesirable for wireless backhaul customers. (The term "wireless backhaul" refers to communication links between cellular base-stations. It is a technology that is linked with carrying communication traffic among sites that are spaced in a circular manner, and is also used for two-way data transmission lines. More generally, error floor issues are a concern in any system requiring very low bit error rates.)

Post-processing is a technique that has been used to resolve a type of decoding errors called "trapping set errors", which dominate in the error floor region. A trapping set error causes the decoder to be trapped in a local minimum with respect to a "cost function" that characterizes the quality of the decoder output. This implies the decoder did not find the global minimum of the cost function and was thus unable to converge to a valid codeword. Post-processing typically resolves trapping set errors by injecting noise into the LDPC decoder to break away from the local minimum (in this case, to find the global minimum point of a cost function which is also the global optimum point) and allow the decoder to converge.

In information theory, a low-density parity-check (LDPC) code is a linear error correcting code for a method of transmitting a message over a noisy transmission channel. An LDPC is constructed using a sparse bipartite graph (A bipartite graph is a graph whose vertices are divided into two independent sets. In a sparse bipartite graph there are relatively few edges or connections between the two sets.) LDPC codes are capacity-approaching codes, which means that practical constructions exist that allow the noise threshold to be set very close, or even arbitrarily close on the canonical binary erasures channel (BEC), to the theoretical maximum (the Shannon limit) for a symmetric memoryless channel. (The binary erasures channel is a common model of a communication channel.) The noise threshold defines an upper bound for the channel noise, up to which the probability of lost information can be made as small as desired. Using iterative BP (belief propagation) techniques, LDPC codes (also known as Gallager codes) can be decoded in time linear to their block length. To form a codeword, the K input data bits are repeated and distributed to a set of constituent encoders. (A "frame" is equal to a codeword. Encoding means taking data bits and computing the corresponding parity bits. These are concatenated together to form the codeword.) The constituent encoders typically are accumulators, and each accumulator is used to generate a parity symbol. A single copy of the original data is transmitted with the parity bits (P) to make up the code symbols. The S bits from each constituent encoder are discarded. The foregoing encoding process is straightforward. The difficult problems lie in practical implementation of the decoding process. A brief description of the decoding process is given below.

The forward error-correction (FEC) requirements for "next-generation" wireless backhaul systems typically require a BER (Bit Error Rate) lower than $10^{-12}$ and a frame error rate lower than $10^{-10}$, a network throughput rate greater than 1 gigabytes per second, low power consumption, and low area in a silicon implementation. LDPC codes are becoming a very good candidate to meet the foregoing requirements, and have demonstrated a capability to provide performance very close to the Shannon limit when decoded with a low complexity iterative decoding algorithm. An LDPC code is defined by a sparse m×n parity check matrix H, where "n" represents the number of bits in the codeword and "m" represents the number of parity checks. A parity check matrix or H matrix contains "1"s and "0"s. Each row of the H matrix represents a parity constraint. For example, one row of the H matrix has n entries in total, with some entries being "1" and others being "0". To define the parity constraint of this row, first note the positions of the "1" entries. Bits in the codeword in these positions must sum up to even parity. In this way, each row of the H matrix defines a different parity constraint involving a different set of bits in the codeword. The H matrix of an LDPC code can be illustrated graphically using a "bipartite graph" or "factor graph", where each bit is represented by a variable processing node (VN) and each check is represented by a check node (CN). A variable node is also called a "bit node" or simply a "bit", and these terms are used interchangeably. An "edge" exists between a variable node "i" and a check node "j" if and only if H(j,i)=1, where H(j,i)=1 means the element on the jth row and ith column of the parity check matrix H equals 1. Therefore, the positions of "1"s in the H matrix show the connections between VNs and CNs.

An LDPC code is decoded using a BP (belief propagation) algorithm that operates on the factor graph. In a BP (Belief Propagation) decoding, "soft messages" representing reliabilities are exchanged between variable nodes (VNs) and check nodes (CNs) to compute the likelihood of whether a bit is 1 or 0. (The "reliabilities" indicate the current belief that a given bit is 1 or 0.) The BP algorithm has two common implementations, including a precise "sum-product algorithm" and an approximate "min-sum algorithm". The min-sum algorithm is simpler to implement and, with suitable modifications, provides excellent decoding performance.

As an example, a binary phase-shift keying (BPSK) modulation and an additive white Gaussian noise (AWGN) communication channel are assumed. The binary values 0 and 1 representing data bits are respectively mapped to 1 and −1 before transmission over the channel. The min-sum decoding can be explained using the factor graph. In the first step of decoding, each variable node $x_i$ is initialized with the subsequently described prior log-likelihood ratio (LLR) based on the received channel output $y_i$. After initialization, variable nodes send the prior LLRs to the check nodes along the edges defined by the factor graph. The LLRs are re-computed based on parity constraints at each check node, and then are returned to the variable nodes. Each variable node then updates its decision based on a "posterior" LLR that is computed as the sum of the prior LLRs from the channel and the LLRs received from the check nodes. One round of message exchange between variable nodes and check nodes completes one iteration of decoding. To start the next iteration, each variable node passes the updated LLRs to the check nodes.

The LLRs passed between variable nodes and check nodes are known as "variable-to-check messages ($L(q_{ij})$)" and "check-to-variable messages ($L(r_{ij})$)", where "i" is the variable node index and "j" is the check node index. In representing the connectivity of the factor graph, Col[i] refers to the set of all the check nodes "connected" to the "i"th variable node and Row[j] refers to the set of all the variable nodes "connected to" the "j"th check node. (The term "connected" refers to the variable nodes and check nodes that exchange messages with each other, i.e., communicate with each other.) A "hard decision" can optionally be made in each iteration based on the above mentioned posterior LLR. (A hard decision can be checked after each iteration, or some iterations can be run first and then checked once afterward.) The iterative decoding is allowed to run until the hard decisions satisfy all of the parity check equations or when an upper limit on the number of iterations is reached.

It is well-known that LDPC decoders suffer from the previously mentioned error floor problems. The post-processing approach and hardware are designed to improve the error floor. Over the past decade, it has been found that the excellent performance of LDPC is only observed up to a moderate bit error rate (BER), leading to the previously mentioned "error floor". The error floor phenomenon can be characterized as an abrupt slope decrease of a code's performance curve past a certain moderate BER level. Solving the error floor problem has been a critical issue for both coding theorists and practitioners, since more and more systems, such as data storage devices and high-speed communications systems, require extremely low error rates.

Solving the error floor problem has been an important focus of research in coding theory and practical decoder designs. Past experiments have shown that error floors can be caused by various practical decoder implementations. Improved algorithm implementation and better numerical quantization can suppress these effects. However, error floors are fundamentally attributed to non-codeword "trapping sets" associated with LDPC codes. A trapping set refers to a set of bits in a codeword which, when received incorrectly, causes the belief propagation (BP) decoding algorithm to be trapped in the above mentioned "local minimum". A trapping can be thought of as a "special combinatorial structure" involving cycles in the LDPC bipartite graph that reinforces incorrect bits during BP decoding.

Much work has been done on lowering the error floor by improving code constructions using methods such as progressive edge growth (PEG), cycle avoidance, code doping, and cyclic lifting. Although these methods are effective, the resulting code structures often complicate the decoder hardware design. An alternative way is to improve the BP decoding algorithm by methods such as scaling, offsetting, or trial and error, but these methods are mostly based on heuristics and their effectiveness is limited. Some of these methods even require extra steps that are incompatible with BP decoding, leading to a higher complexity and much longer latency (the time it takes for the decoder to produce the decoded codeword). A theoretically more effective approach is to target the combinatorial structures of absorbing sets to modify the decoding algorithm, an example of which is the bi-mode syndrome erasure decoding algorithm, although it sometimes falls short when the erasure decoding runs into its own local minima. For example, See "An Efficient 10 GBASE-T Ethernet LDPC Decoder Design with Low Error Floors" by Zhengya Zhang, et. al, IEEE Journal of Solid-State circuits, Volume 45, No. 4, April, 2010, especially FIG. 7 which shows hard decision outputs used to determine whether a message should be biased before check node processing. Also see "Lowering LDPC Error Floors by Postprocessing" by Zhengya Zhang, et al., for publication in the IEEE "GLOBECOM" 2008 proceedings.

The above-mentioned prior art in post-processing hardware only injects noise once (single-shot noise injection) in the decoding process. Furthermore, the prior art in post-processing hardware only allows changing magnitude of the noise. In the error floor region, the prior art LDPC decoders cannot successfully decode certain received codewords. Prior art post-processing helps the decoder decode some of these failures, but the real goal is to be able to decode all of the failures, and unfortunately, the techniques of the prior art can only resolve a limited type and number of errors. This consequently directly limits the amount of error floor improvement that as a practical matter is achievable by the prior art.

Thus, there is an unmet need for a better way of solving the error floor problems that have been critical issues in designing data storage devices and high-speed communications systems which require extremely low error rates.

There also is an unmet need for a post-processing system and method that can resolve more types of decoding errors than the prior art, thus improving the bit error rate in the error floor region.

There also is an unmet need for a post-processing system and method for implementing the described post-processing technique that are compatible with existing high throughput decoder architectures.

There also is an unmet need for improved post-processing capable of better improving the error floor for LDPC decoding for a substantially higher bit error rate (BER) then has been achievable by prior art post-processing.

SUMMARY OF THE INVENTION

It is an object of the invention to provide a better way of solving the error floor problems that have been critical issues in designing data storage devices and high-speed communications systems that require extremely low error rates.

It is another object of the present invention to provide a post-processing system and method that can resolve decoding errors in the low bit error region more effectively than the prior art.

It is another object of the present invention to provide a post-processing system and method that can resolve more types of decoding errors in the low bit error rate (BER) region than the prior art.

It is another object of the present invention to provide a post-processing system and method that can resolve more types of decoding errors than the prior art in the low bit error rate (BER) region by injecting noise of different durations and/or magnitudes over multiple iterations to resolve errors caused by different types of trapping set structures that a single noise injection alone cannot resolve.

It is another object of the present invention to provide a post-processing system and method that can resolve more types of decoding errors than the prior art in the low bit error rate (BER) region by performing neighborhood relabeling (i.e. dynamically changing the locations of noise injection) so as to affect a larger set of nodes in the LDPC code structure.

It is another object of the present invention to provide a post-processing system and method that can resolve more types of decoding errors than the prior art in the low bit error rate (BER) region by providing a mechanism to trigger post-processing only upon detection of a trapping set error so that there is no latency penalty when the decoder is decoding frames that do not require post-processing.

It is another object of the invention to provide improved post-processing capable of better improving the error floor for LDPC decoding for a substantially higher bit error rate (BER) than has been achievable by prior art post-processing.

Briefly described, and in accordance with one embodiment, the present invention provides post-processing circuitry for LDPC decoding includes check node processor (7-3) for processing shifted LLR values, a hard decision decoder circuitry (7-10) for receiving processed LLR information and performing parity checks on the processed LLR information. Post-processing control circuitry (7-9) controls updating of LLR information in the check node processor. The check node processor, hard decision decoder, and control circuitry cooperate to identify check nodes with unsatisfied parity checks after an iteration cycle, identify neighborhood variable nodes that are connected with unsatisfied check nodes, identify satisfied check nodes which are connected to neighborhood variable nodes, and modify messages from neighborhood variable nodes to satisfied check nodes if needed to introduce perturbations to resolve decoding errors due to trapping sets. Neighborhood identification circuitry (21) determines which variable nodes are connected with unsatisfied check nodes, that have failed a parity check, and produces a signal ND[Z-1:0] indicating which variable nodes are connected to unsatisfied check nodes.

In one embodiment, the invention provides post-processing circuitry (7) for LDPC (Low Density Parity Check) decoding including check node processor circuitry (7-3) for receiving and processing LLR (Log-Likelihood Ratio) values, hard decision decoder circuitry (7-10) for receiving processed LLR information that may have been modified by the check node processor circuitry (7-2) and performing parity check operations on the received and processed LLR information, and post-processing control circuitry (7-9) coupled to the check node processor circuitry (7-3) for controlling updating of LLR information in the check node processor circuitry (7-3) in response to parity check decisions by the hard decision decoder (7-10), and wherein the check node processor circuitry (7-3), hard decision decoder circuitry (7-10), and post-processing control circuitry (7-9) cooperate to identify check nodes whose parity checks are unsatisfied after an iteration of the post-processing circuitry (7), identify neighborhood variable nodes that exchange messages with check nodes which are unsatisfied after an iteration of the decoding and post-processing circuitry (7), identify satisfied check nodes which exchange messages with neighborhood variable nodes, and modify messages from neighborhood variable nodes to satisfied check nodes to a new value if needed to introduce perturbations that effectively resolve decoding errors due to trapping sets and improve bit error rate performance of the LDPC decoding, post-processing control circuitry (7-9) that allows the set of neighborhood variable nodes to be optionally updated during post-processing; and neighborhood identification circuitry (21) associated with the hard decision decoder circuitry (7-10) and the post-processing control circuitry (7-9) determines which variable nodes of a parity check matrix (1) are connected with unsatisfied check nodes of the parity check matrix (1) wherein the unsatisfied check nodes have failed a parity check, and producing a first signal (ND[Z-1:0] on sub-bus 27 of bus 13) that indicates which variable nodes are connected to unsatisfied check nodes.

In one embodiment, the shifted LLR values are generated by first shifter circuitry (7-2) which receives initial LLR values from an LLR buffer (7-1), and wherein contents of the check node processor circuitry (7-3) are output to second shifter circuitry (7-4), wherein information shifted by the second shifter circuitry (7-4) is re-aligned relative to the initial LLR values and then input to variable node processor circuitry (7-5), wherein information processed by the variable node processor circuitry (7-5) is provided as an updated input to the hard decision decoder (7-10) and to an updated LLR input of the LLR buffer (7-1), and wherein the first (7-2) and second (7-4) shifter circuitry, the check node processor circuitry (7-3) and the variable node processor circuitry (7-4) are controlled by post-processing controller circuitry (7-9) so as to cause the check node processor circuitry (7-5) to modify LLR information therein according to parity check decisions of the hard decision decoder (7-10).

In one embodiment, the post-processing control circuitry (7-9) includes message biasing circuitry (29) for introducing the perturbations, wherein the message biasing circuitry (29) includes circuitry (31-1,2,3) for introducing multiple perturbations of differing characteristics during a particular iteration cycle to resolve more types of decoding errors due to different trapping set structures in an LDPC code.

In one embodiment, the post-processing control circuitry (7-9) includes message biasing circuitry (29) for introducing the perturbations, wherein the message biasing circuitry (29) includes circuitry (31-1,2,3) for controlling duration of a perturbation during a particular iteration cycle.

In one embodiment, the post-processing control circuitry (7-9) includes message biasing circuitry (29) including (1) shifting circuitry (30) for shifting the first signal (ND[Z-1:0]) by a shift value (30-1) determined by the parity check matrix (1) to produce a second signal (NCD[Z-1:0]) that indicates all of the check nodes which are connected to neighborhood variable nodes, and (2) satisfied check nodes selecting circuitry (31) for receiving the second signal (NCD[Z-1:0]) and operating to select check nodes which have satisfied parity checks during a prior iteration cycle of the hard decision decoder circuitry (10).

In one embodiment, the hard decision decoder (7-10) includes third shifter circuitry (15-2) receiving the processed LLR information, shift value generator circuitry (15-1) for generating shift values to be provided as inputs to the third, shifter circuitry (15-2), bit-wise exclusive OR circuitry (15-3) for performing parity checks corresponding to bits of the parity check matrix (1), respectively, and parity check register circuitry (15-4) having inputs coupled to corresponding outputs of the bit-wise exclusive OR circuitry (15-3), the parity check register circuitry (15-4) receiving parity check results from the bit-wise exclusive OR circuitry (15-3).

In one embodiment, the bit-wise exclusive OR circuitry (15-3) includes exclusive OR circuits each having a first input coupled to an output of a corresponding bit of the third shifter circuitry (15-2), respectively, and a second input coupled to an output of a corresponding bit of the parity check register circuitry (15-4), respectively, for performing bit-wise parity check operations associated with corresponding bits of the parity check matrix (1).

In one embodiment, the hard decision decoder (7-10) includes parity check counter circuitry (15-6) coupled to an output (18) of the parity check register circuitry (15-3) for counting parity check failures, and post-processing trigger circuitry (15-7) coupled to the parity check counter circuitry (15-6) for disabling post-processing if the number of failures indicated by the parity check counter circuitry (15-6) exceeds a predetermined value.

In one embodiment, the hard decision decoder (7-10), the exclusive bit-wise OR circuitry (15-3) and the third shifter circuitry (15-2) cooperate to align hard decision values output by the bit-wise exclusive OR circuitry (15-3) with corresponding parity check bits of the parity check register circuitry (15-4).

In one embodiment, shift value generator circuitry (23) generates shift values as inputs to fourth shifter circuitry (21-2) to reverse shifting performed in response to the shift value generator circuitry (15-1). In one embodiment, the decoding errors are due to trapping sets.

In one embodiment, the invention provides a method for performing LDPC (Low Density Parity Check) decoding, including shifting and processing LLR (Log-Likelihood Ratio) values; receiving processed LLR information that may have been modified by check node processor circuitry (7-3) and performing parity check operations on the received and processed LLR information by means of hard decision decoder circuitry (7-10); controlling updating of LLR information in response to parity check decisions by the hard decision decoder circuitry (7-10) and identifying check nodes whose parity checks are unsatisfied after an iteration of the hard decision decoding circuitry (7-10) and the post-processing circuitry (7); neighborhood variable nodes that exchange messages with check nodes which are unsatisfied after an iteration of the post-processing circuitry (7) by means of the hard decision decoder (7-10); producing a first signal (ND[Z-1:0]) on sub-bus 27 of bus 13) that indicates which neighborhood variable nodes are connected to unsatisfied check nodes; identifying neighborhood satisfied check nodes which exchange messages with the variable nodes of interest and modifying messages from variable nodes to satisfied check nodes to a new value if it is necessary to introduce perturbations that effectively resolve decoding errors due to trapping sets and improve bit error rate performance of the LDPC decoding (note that the variable nodes of interest are the satisfied check nodes that exchange messages with the variable nodes mentioned in the previous clause, not all variable nodes); and determining which variable nodes of a parity check matrix (1) are connected with unsatisfied check nodes of the parity check matrix (1) wherein the unsatisfied check nodes have failed a parity cheek.

In one embodiment, the method includes storing the identified neighborhood variable nodes that determine which check nodes receive modified messages, and selectively updating neighborhood registers (47-3) at different post-processing iterations in response to a relabeling flag signal (47-4) to introduce multiple types of perturbations to improve bit error rate performance of the LDPC decoding.

In one embodiment, the method includes transferring the shifted LLR values from first shifter circuitry (7-2) to check node processor circuitry (7-3), processing the shifted LLR values by means of the check node processor (7-3), and transferring the processed LLR values to second shifter circuitry (7-4) to re-align the processed LLR values relative to the initial LLR values, providing re-aligned information as an updated input to the hard decision decoder (7-10) and to the first shifter circuitry (7-2) to cause the check node processor circuitry (7-5) to modify LLR information therein according to parity check decisions of the hard decision decoder (7-10).

In one embodiment, the method includes shifting the first signal (ND[Z-1:0]) indicating neighborhood variable nodes by a shift value (30-1) determined by the parity check matrix (1) to produce a second signal (NCD[Z-1:0]) that indicates all of the check nodes which are connected to neighborhood variable nodes, and then selecting from the second signal (NCD[Z-1:0]) all check nodes which have satisfied parity checks during a prior iteration cycle of the decoding circuitry (7-10) and the post-processing circuitry (7).

In one embodiment the method includes generating shift values and shifting processed LLR information in the third shifter circuitry (15-2) in accordance with the shift values, performing parity checks as prescribed by the parity check matrix (1) by comparing the shifted bits with corresponding bits in parity check results circuitry (15-4) that is coupled to outputs of bit-wise exclusive OR circuitry (15-3) which performs the comparing.

In one embodiment the method includes the bit-wise exclusive OR circuitry (15-3) includes exclusive OR circuits each having a first input coupled to an output of a corresponding bit of the third shifter circuitry (15-2), respectively, and a second input coupled to an output of a corresponding bit of the parity check register circuitry (15-4), respectively, the method including operating the bit-wise exclusive OR circuitry (15-3) to perform bit-wise parity check operations associated with corresponding bits of the parity check matrix (1).

In one embodiment the method includes operating the hard decision decoder (7-10), the bit-wise exclusive OR circuitry (15-3) and the third shifter circuitry (15-2) align hard decision values output by the variable node processors via bus 10 in FIG. 3 with corresponding bits (i.e., then intermediate parity check values) in the of parity check register circuitry (15-4). In one embodiment, the decoding errors are due to trapping sets.

In one embodiment, the invention includes a system for performing LDPC (Low Density Parity Check) decoding, the system including means (7-2,3,4) for shifting and processing LLR (Log-Likelihood Ratio) values; means (15-2) for receiving processed LLR information that may have been modified by check node processor circuitry (7-2) and means (15-3) for performing parity check operations on the received and processed LLR information by means of hard decision decoder circuitry (7-10); means (15-1,3,4) in the hard decision decoder circuitry (7-10) for controlling updating of LLR information in response to parity check decisions by the hard decision decoder (7-10) and identifying check nodes whose parity checks are unsatisfied after an iteration of the hard decision decoding circuitry (7-10) and the post-processing circuitry (7); means (21) for identifying neighborhood variable nodes that exchange messages with check nodes which are unsatisfied after an iteration of the hard decision decoding circuitry (7-10) and the post-processing circuitry (7); means (25) for producing a first signal {ND[Z-1:0]} on sub-bus 27 of bus 13} that indicates which neighborhood variable nodes which are connected to unsatisfied check nodes; means [29,7-3] for identifying satisfied check nodes which exchange messages with neighborhood variable nodes and modifying messages from neighborhood variable nodes to satisfied check nodes to a new value if it is necessary to introduce perturbations that effectively resolve decoding errors due to trapping sets and improve bit error rate performance of the LDPC decoding; and means [21,21-2,23] for determining which variable nodes of a parity check matrix [1] are connected with unsatisfied check nodes of the parity check matrix [1] wherein the unsatisfied check nodes have failed a parity check.

BRIEF DESCRIPTION OF THE DRAWINGS

FIG. 7: LDPC illustrates a decoder pipeline schedule without post-processing.

FIG. 8 illustrates a LDPC decoder pipeline schedule that includes post-processing.

DETAILED DESCRIPTION OF THE PREFERRED EMBODIMENTS

Figure 1:
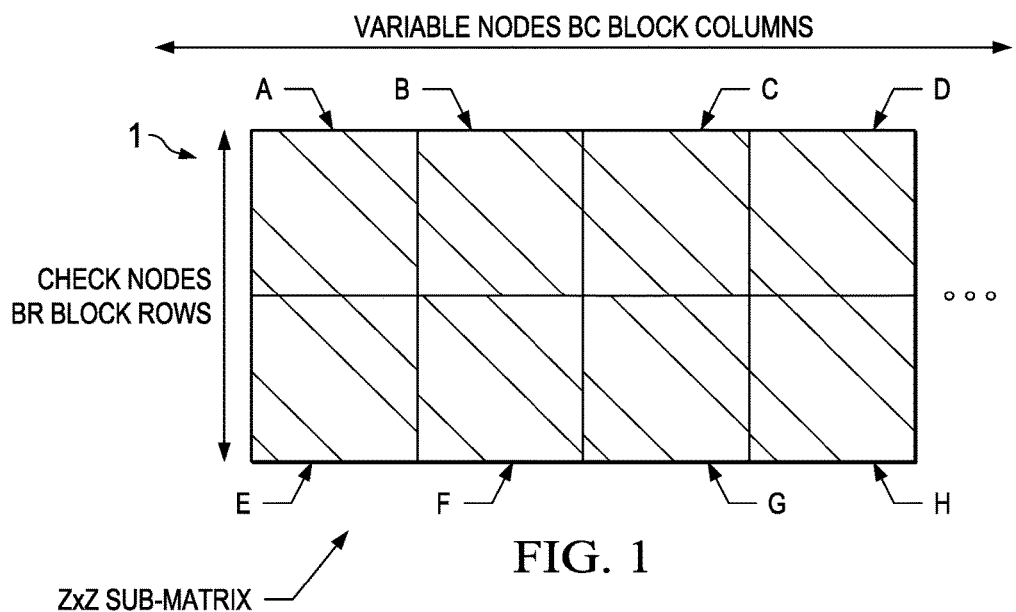
FIG. 1 shows a parity check matrix (H matrix) of a QC-LDPC code.

This invention describes hardware that implements a new post-processing algorithm for addition to a high-throughput LDPC decoder. One embodiment of the new hardware post-processor implementation is designed for error floor mitigation in a parallel QC-LDPC ("Quasi-Cyclic" LDPC) decoder. The post-processing algorithm injects noise of controllable duration (and also controllable magnitude, if desired) into the decoder to help the decoder output converge to a valid codeword. The post-processing algorithm can be applied to QC-LDPC decoder architectures and also to other types of decoder architectures. In one embodiment, the post-processing algorithm and hardware may operate to lower the error floor by a factor of nearly 10.

As previously indicated, some LDPC codes are known to exhibit error floors (i.e. a reduction in the slope of the bit error rate (BER) versus channel signal-to-noise ratio (SNR) curve) at low BER levels. This implies that in the error floor region, a large increase in the channel SNR results only in a small decrease in the BER. This is undesirable in communication systems requiring very low bit error rates. An LDPC code can be represented by its parity check matrix, also called a H matrix. Each column of the H matrix represents a variable node. Each row of the H matrix corresponds to a check node. (A variable processing node VN is a type of processing engine inside an LDPC decoder and a check processing node CN is another type of processing engine inside the LDPC decoder.) A typical decoding process for LDPC codes involves messages being passed between the VNs and CNs. The messages represent the current confidence that each bit in the codeword being decoded is logic "0" or logic "1". If the decoding process does not converge to a valid codeword (i.e. a codeword that does not satisfy all parity checks specified in the H matrix), then typically the decoding process is considered to have failed. In this invention, a noise injection process can be executed in this scenario to help the decoder converge to a valid codeword.

The above mentioned noise injection process involves (1) identifying the check nodes whose parity checks are unsatisfied (such check nodes are referred to by "OD") after an iteration; (2) identifying variable nodes (referred to by "ND") that are "connected" to the check nodes OD; (3) identifying "satisfied" check nodes (referred to by "SD") "connected" to variable nodes ND; and (4) changing/modifying variable-to-check messages from variable nodes ND to satisfied check nodes SD to new values "L" in accordance with parity check decisions, if needed. (As previously mentioned, the term "connected" refers to the variable nodes and check nodes that exchange messages with each other.) The described post-processing hardware performs the above mentioned post-processing algorithm.

The post-processing algorithm is designed to alleviate the adverse effects of trapping sets, which can be thought of as patterns with undesirable effects in the H matrix. The post-processing algorithm and adjusts the "strength" of messages in BP (Belief Propagation) decoding to achieve a perturbation effect. The perturbation breaks a tendency for the decoder be stuck in an incorrect state by weakening the influence of incorrectly decoded bits on the decoder state. The perturbation can also strengthen the push towards a successful convergence of the codeword being decoded.

FIG. 1 shows a LDPC parity check matrix or "H matrix" 1 of a QC-LDPC (Quasi-Cyclic Low Density Parity Check) code. Parity check matrix 1 is composed of a number of Z×Z submatrices A, B, . . . H as illustrated. The various sloped lines in the submatrices pass through "1" s in the submatrices, respectively. Each row of H matrix 1 defines a parity check which must be satisfied by a valid codeword. The sloped line indicates "1" s in H matrix 1, and the remaining entries are "0" s. In a soft decision decoding algorithm, each column in H matrix 1 corresponds to a variable node, while each row corresponds to a check node. A "1" in H matrix 1 indicates that a variable node is "connected" to (i.e. exchanges messages with) a check node. The QC-LDPC H matrix 1 in FIG. 1 is composed of sub blocks or submatrices labeled A-H. There are "BC" Block Columns and "BR" Block Rows. Each sub-matrix A-H is a circulant matrix, which is important for hardware implementation. (A circulant matrix is a matrix in which each row is rotated 1 element to the right relative to the previous row.)

A circulant matrix can be completely characterized by the positions of "1" s in the first row, which are also called the "shift values". The shift values provide a convenient way to find which check node is "connected" to a given variable node. Each H matrix and each submatrix consists of rows and columns of "0" s and "P's. The sloped lines in FIG. 1 can be thought of as being drawn through the" 1"s that appear in the various submatrices. The sloped lines therefore indicate the locations of the "1" s in H matrix 1. A "1" in the H matrix indicates that a variable node and a corresponding check node need to send messages back and forth (i.e., that the variable node and check node are "connected"). Each column of H matrix 1 represents a variable node. As an example, the leftmost column corresponds to the 0th or first column CN0 and the second column from the left edge corresponds to the second column CN1, and so forth.

Figure 2:
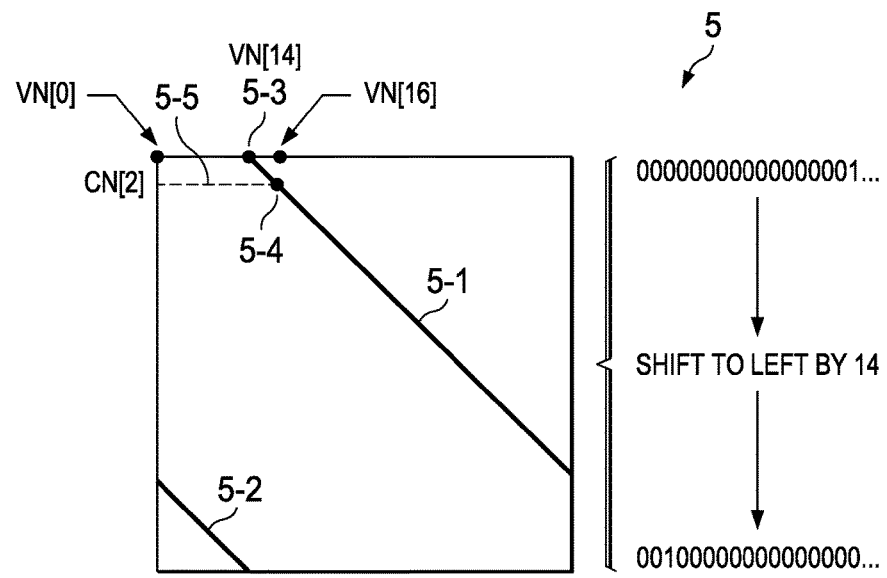
FIG. 2 shows an example of using shifts to find "connected" variable processing nodes (VNs) and check processing nodes (CNs).

FIG. 2 illustrates a single Z×Z submatrix 5 which may be any of the submatrices A, B, . . . H in parity check matrix 1 of FIG. 1. In FIG. 2, the tops of the columns which represent the variable nodes of submatrix 5 lie along its horizontal top edge. For example, the upper end of sloped line 5-1 intersects the horizontal top edge of submatrix 5 at a point 5-3 which represents the top of a column (i.e., variable node VN[14]). Two other points are identified along the upper edge of submatrix 5 to represent the top edges of a first variable node column or first variable node VN[0] and a sixteenth variable node column VN[16], respectively. (Another sloped line 5-2 is also illustrated.) A dashed horizontal line 5-5 intersects the left end of a row or check node CN[2]. Horizontal line 5-5 intersects sloped line 5-1 at a point 5-4 directly under the point identified as VN[16].

FIG. 2 also shows how sub-matrix 5 uses "shifts" to detect "connected" variable nodes VNs and check nodes CNs. In the example of FIG. 2, the shift value is 14. If it is desired to find the check node "connected" to the variable node at index position 16 (starting from 0), a bit vector can be initialized with a "1" at index 16 and "0" elsewhere, then this bit vector can be shifted to the left by the shift value 14. (For example, if all the variable processing nodes are lined up in sequence, the leftmost variable node VN has index 0 and the $17^{th}$ variable node VN has index 16.) This results in a bit vector with a "1" at index 2, which means that check node 2 is "connected" to variable node 16, that is, to variable node VN[16]. This kind of description will be used several times in the neighborhood identification method described later. The shift value is the distance between the left edge of a particular submatrix and the first intersection or "1" in the first row of that submatrix.

In FIG. 2, the left ends of the rows which represent the check nodes of submatrix 5 lie along its vertical left edge. The point 5-3 of sloped line 5-1 in FIG. 2 closest to the top edge of submatrix 5 indicates that variable node 14, i.e., VN[14], is "connected" to check node 0, i.e., VN[0]. The point 5-4 of sloped line 5-1 is "connected" to the horizontal dashed line 5-5, and this means variable node 16 is "connected" to check node 2, i.e., to check node CN[2]. Thus, sloped line 5-1 indicates which variable node VN is "connected" to which check node CN. Typically, each of variable nodes VN[0, 1 . . . ] along the top edge of submatrix 5 contains some data which that variable node needs to transfer to a "connected" check node. Messages can be passed from the variable nodes to the check nodes "connected" thereto, by taking the left horizontal array of messages and then circularly "rotating" this array. After this "rotation", the array of messages can be directly fed to the array of check nodes and each message would go to the correct check node. The reason that such "rotation" works is that variable node VN[14] is "connected" to check node CN0, and variable node VN[15] is "connected" to check node CN1, and so forth, and by "shifting" all variable nodes to the left by 14 positions or index values, all of the variable node messages VN[0, 1 . . . ] are "aligned" with their "connected" check nodes CN[0, 1 . . . ].

Figure 3:
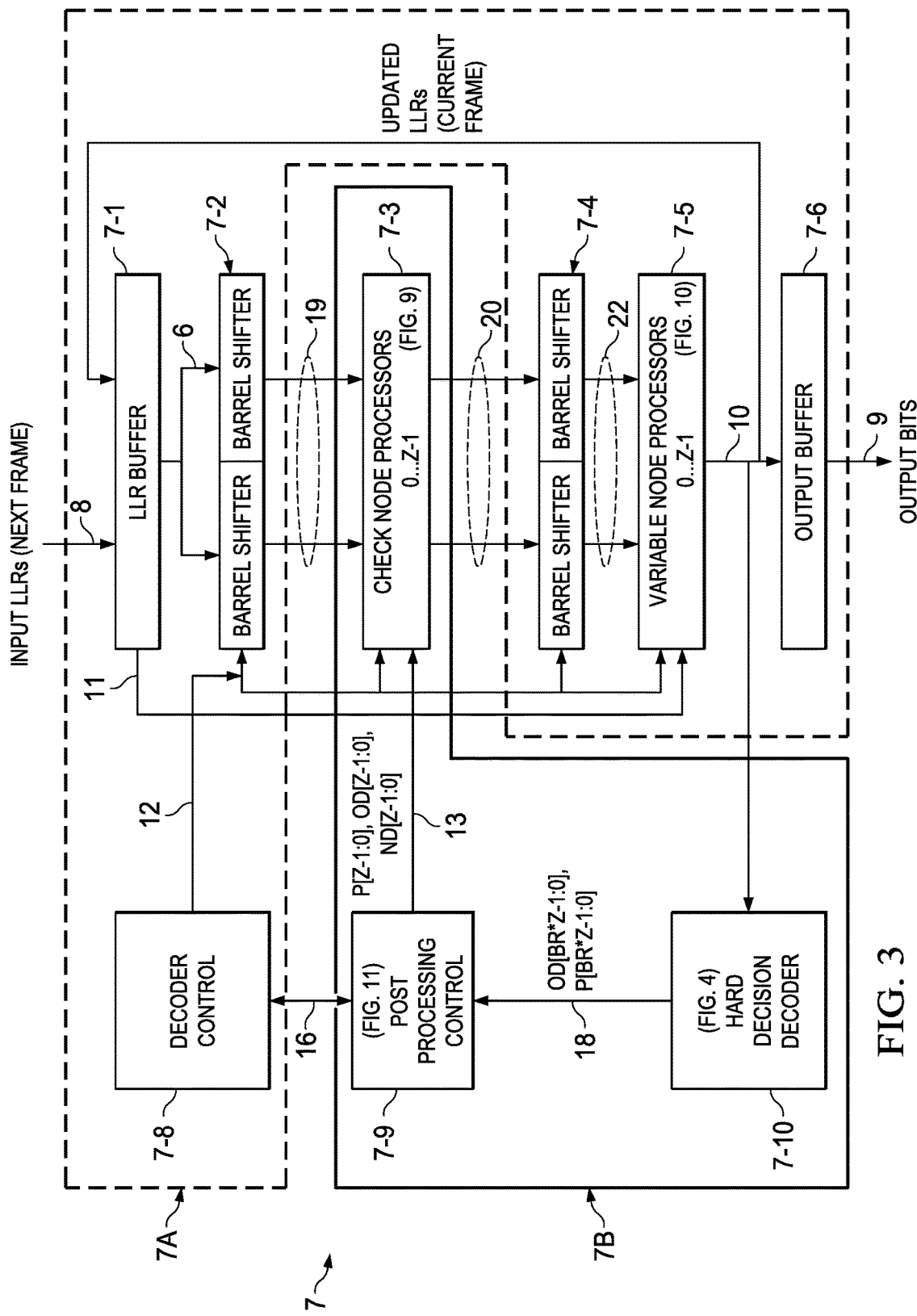
FIG. 3 indicates the top level block diagram of a QC-LDPC decoder and associated post-processing hardware.
Figure 5:
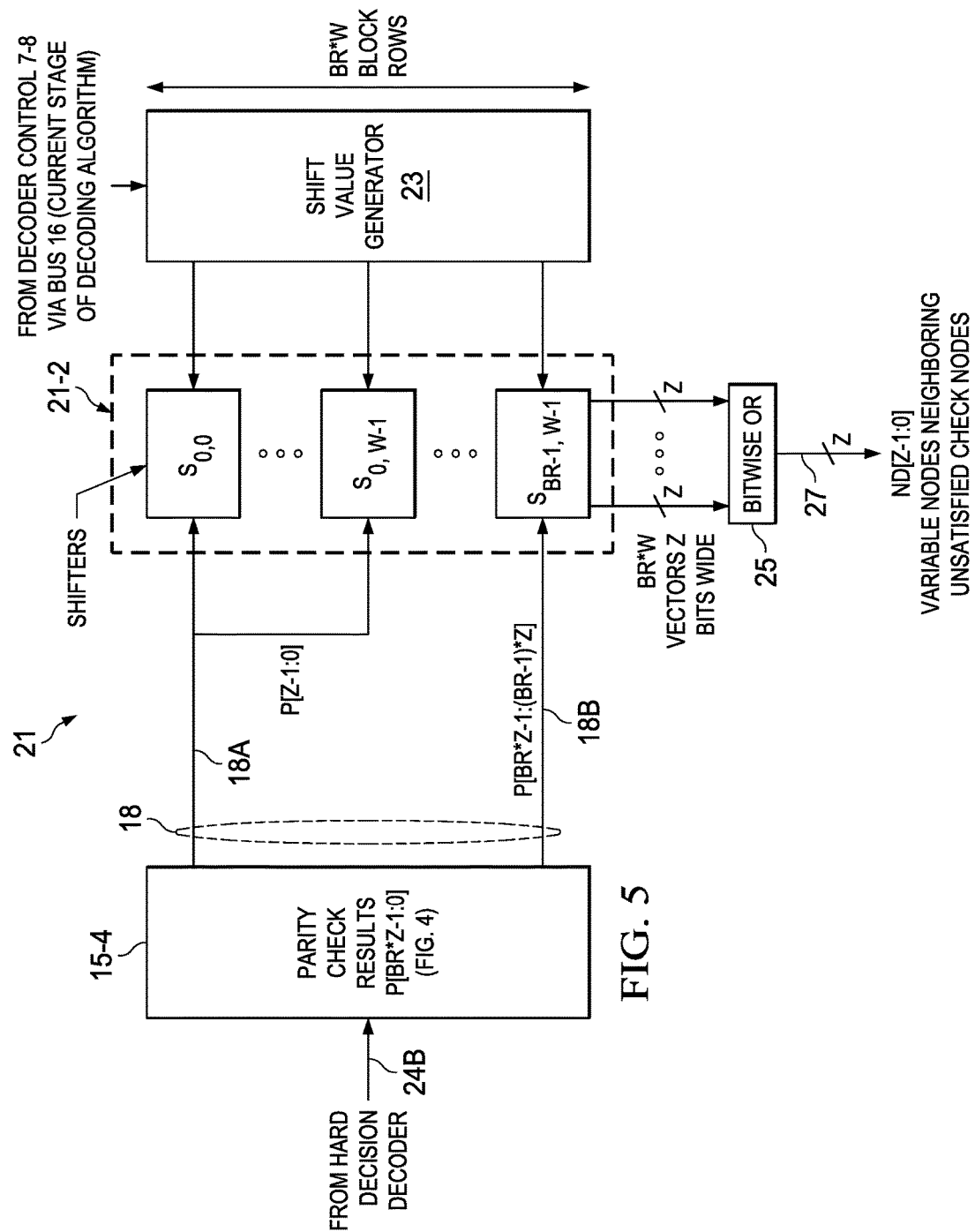
FIG. 5 is a block diagram of circuitry for obtaining neighborhood identification ND.
Figure 6:
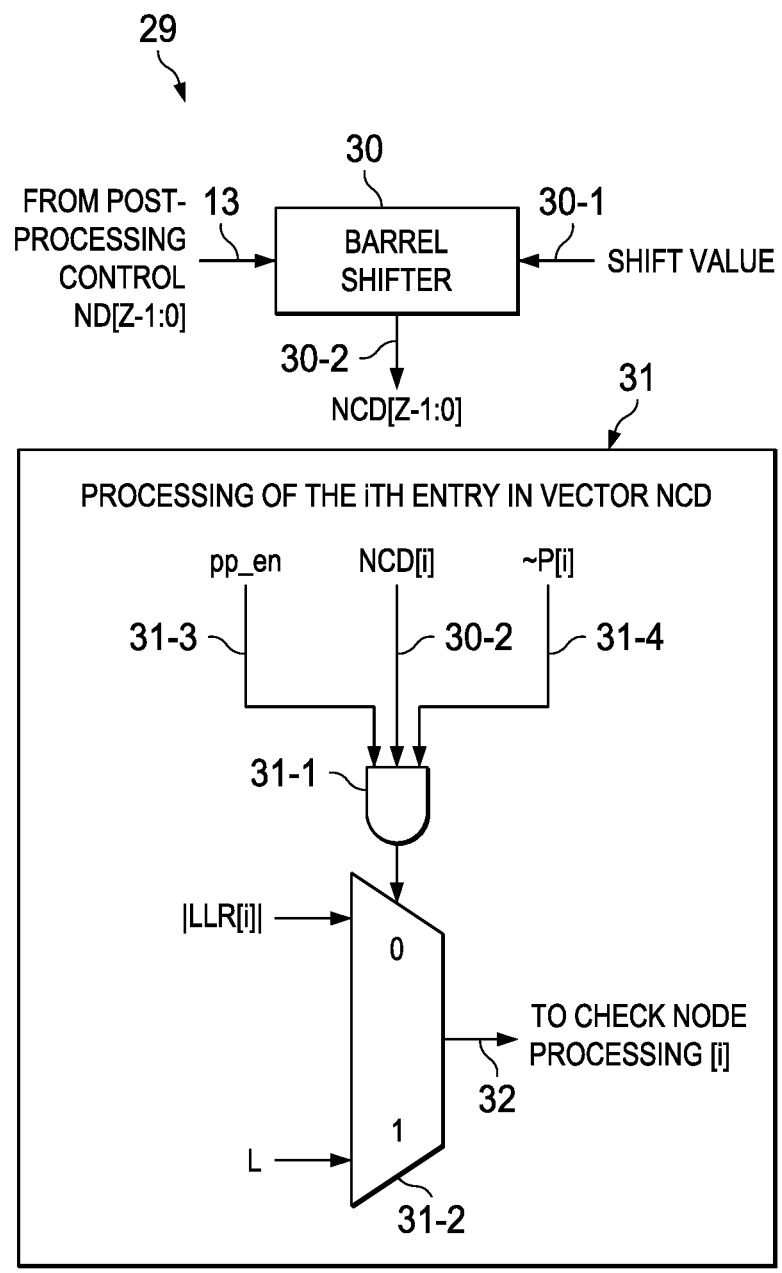
FIG. 6 shows a block diagram of a message biasing mechanism located in the check node processors of FIG. 3.
Figure 9:
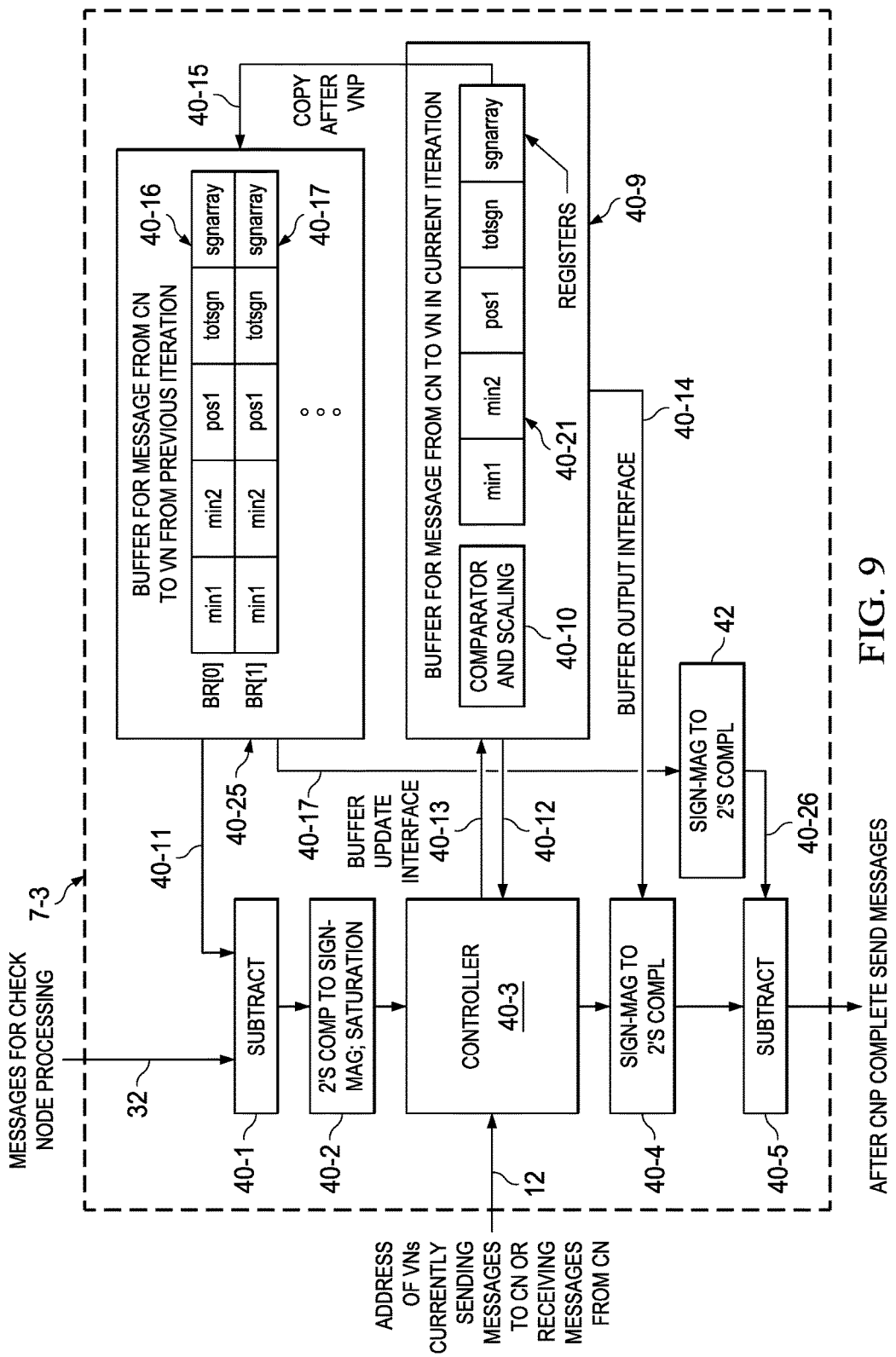
FIG. 9 is a block diagram useful in describing the structure and operation of the check node processors in block 7-3 of FIG. 3.

FIG. 3 shows a block diagram of a QC-LDPC decoder 7 which includes conventional QC-LDPC decoder circuitry 7A and also includes post-processing circuitry 7B in accordance with the present invention. The conventional LDPC decoder circuitry 7A includes decoder control circuit 7-8, LLR (Log-Likelihood Ratios) buffer 7-1, barrel shifters 7-2, barrel shifters 7-4, variable node processors 7-5 (details of which are shown in subsequently described FIG. 10), and output buffer 7-6. Post-processor circuitry 7B includes check node processors 7-3 (details of which are shown in FIG. 9), post-processing control circuit 7-9 (details of which are shown in FIGS. 5, 6, and 11), and hard decision decoder 10 (details of which are shown in subsequently described FIG. 4).

Outputs of decoder control circuit 7-8 are coupled by bus 12 to inputs of barrel shifters 7-2, check node processors 7-3, barrel shifters 7-4, and variable node processors 7-5. Post-processing control circuit 7-9 produces two output vectors OD[Z-1:0] and ND[Z-1:0] which are coupled by bus 13 to inputs of check node processors 7-3. Decoder control circuit 7-8 is coupled by bus 16 to post-processing control circuit 7-9.

A first input of LLR buffer 7-1 receives a next frame of input LLR values via bus 8 and a second input of LLR buffer 7-1 receives a current frame of updated LLR values from variable node processor output bus 10. Outputs of barrel shifters 7-2 are coupled by bus 6 to inputs of check node processors 7-3. Another output of LLR buffer 7-1 is coupled by bus 11 to other inputs of variable node processors 7-5. (LLR buffer contents are needed by check nodes CN and variable nodes VN at different times during decoding.) Outputs of check node processors 7-3 are coupled by bus 20 to inputs of barrel shifters 7-4. Outputs of barrel shifters 7-4 are coupled by bus 22 to other inputs of variable node processors 7-5. Output bus 10 of variable node processors 7-5 is coupled to an input of hard decision decoder 7-10, an input of output buffer 7-6, and the second input of LLR buffer 7-1. The inputs and outputs of the check nodes CN are generally different in value. The check nodes CN will take inputs and produce outputs as a function of the inputs. Output buffer 7-6 produces output bits on bus 9. Hard decision decoder 7-10 generates an output on bus 18 which is coupled to an input of post-processing control circuit 7-9. The post-processing control circuit 7-9 is coupled by bus 16 to the main decoder control circuit 7-8. For example, main decoder circuit 7-8 sends signals to post-processing control circuit 7-9 to indicate the current stage of the decoder operation (e.g. the current iteration, which LLRs are being processed, etc.).

Post-processor 7-9 in FIG. 3 requires hard decision decoder 7-10 to receive sign bits (+ or −) of the updated LLRs (Log-Likelihood Ratios) received by LLR buffer 7-1 and perform the parity checks defined by H matrix 1 of FIG. 1. The values in LLR buffer 7-1 indicate the level of confidence that a particular bit in a received message represents a logical "0" or a "1" level. The results of the parity checks identify which check nodes OD are not "satisfied" (i.e., the associated parity check is not satisfied), and are passed to the post-processing control circuit 7-9. Post-processing control circuit 7-9 finds or detects the variable nodes ND that are "connected" to OD nodes, and passes the addresses of variable nodes ND to the message bias circuit 29 of FIG. 6. Check node processors 7-3 receive the noise injection or message bias injection generated by subsequently described message bias circuit 29 of FIG. 6, which may be included within post-processing control circuit 7-9. The addresses of satisfied check nodes SD provided by post-processing control circuit 7-9 are used by message biasing circuit 29 of FIG. 6 to modify the variable-to-check message from the ND nodes to the SD nodes, if needed. (Note that both satisfied check nodes (OD) and satisfied check nodes (SD) are computed by the hard decision decoder 7-10.) Post-processing control circuit 7-9 of post-processing circuitry 7B also includes conventional control circuitry, including circuitry required to control the performance of the exclusive OR operations of bit-wise XOR (exclusive OR) circuitry in block 15-3, to clock the parity check registers 15-4 etc.

LLR buffer 7-1 in FIG. 3 indicates the "confidence" or "belief" that each bit in the received message is a "1" or "0". The number of columns of the parity check H matrix 1 in FIG. 1 indicates the number of bits in the error correcting code in any particular variable node, i.e., column. In each submatrix there is one LLR buffer entry for each variable node column. The number of columns of each submatrix is Z. The number of bits in the entire error correcting code in H matrix 1 is equal to Z times the number of submatrices along the horizontal dimensions of H. Barrel shifters 7-2 implement the bit shifting technique previously described with reference to FIG. 2. In operation, shifters 7-2 in FIG. 3 receive the LLR buffer messages corresponding to each variable node column of the submatrix and shift the messages appropriately so as to send them to the "connected" check node. The outputs of barrel shifters 7-2 couple the appropriate LLR values of the various "connected" check nodes which perform part of the processing needed to update to the LLR values. After the check node processors 7-3 in FIG. 3 finish their computations, they send the results back to the "connected" variable nodes. This is accomplished by a "reverse shifting" process performed by barrel shifters 7-4 to re-align the processed LLR message bits relative to their initial positions.

Each check node along the left edge of submatrix 5 in FIG. 2 has values which will be shifted to be aligned with the variable nodes "connected" to that cheek node so, in effect, information is being sent from the left edge of submatrix 5 in FIG. 2 to the top edge thereof. Variable node processors 7-5 in FIG. 3 receive incoming data and then update the values in LLR buffer 7-1, via bus 10. This iterative process typically is repeated roughly 10 to 15 times. At the end of the 10 to 15 iterations, signs (+ or −) of the LLR values indicate whether the decoded message bit is a "0" or a "1", and that value is stored in output buffer 7-6.

At the end of each iteration through the foregoing loop, hard decision decoder 7-10 looks at the sign bits of the LLRs and determines if all of the parity cheeks in this code are satisfied. Details of hard decision decoder 7-10 of FIG. 3 are shown in FIG. 4.

Figure 4:
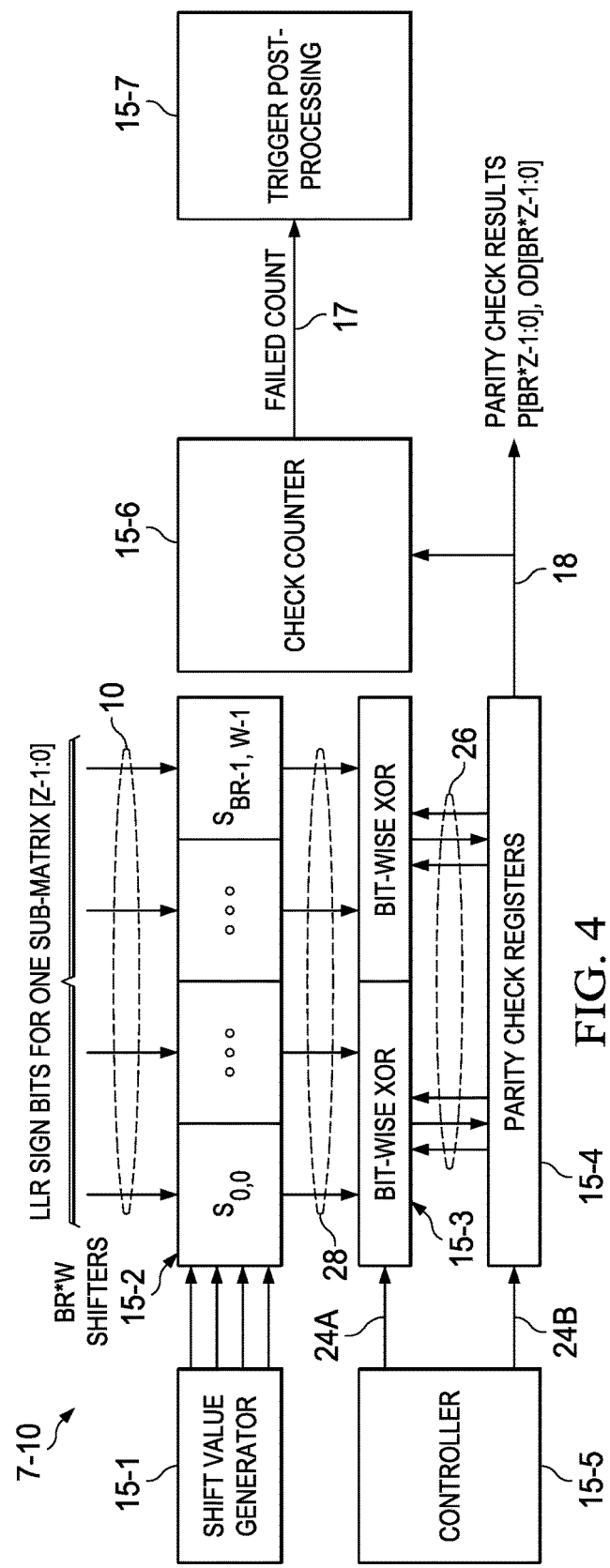
FIG. 4 is a block diagram of the hard decision decoder block shown in FIG. 3.

Referring to FIG. 4, hard decision decoder 7-10 includes a shift value generator 15-1 that generates shift values and provides them as an input to a shift circuit 15-2 having bits $S_{0,0}, S_{0,2}, \ldots, S_{BR-1,W-1}$, where BR is the number of columns of each parity check matrix and W indicates the number of 1's in each row of the submatrix. The sign bits for a submatrix are applied as inputs to the shift circuit bits $S_{0,0}, S_{0,2}, \ldots, S_{BR-1,W-1}$, respectively, via bus 10. The outputs of shift circuit 15-2 are applied by bus 28 to a first set of inputs of bit-wise exclusive OR (XOR) circuit 15-3. The second set of inputs of exclusive OR circuitry 15-3 is coupled by some of the conductors of bus 26 to outputs of parity check registers 15-4. Outputs of bit-wise exclusive OR circuit 15-3 are applied by some of the conductors of bus 26 to inputs of a parity check register circuit 15-4. A control circuit 15-5 generates control signals that are applied by bus 24A to another input of bit-wise exclusive OR circuit 15-3 and also generates signals that are applied via bus 24B to another input of parity check register circuit 15-4. An output of parity check register circuit 15-4 is produced on bus 18 and is coupled to an input of a check counter circuit 15-6. The parity check results on bus 18 include a parity check results vector $P\{BR*[Z-1:0]\}$. A "failed count" output produced on bus 17 by check counter circuit 17 is utilized to trigger a post-processing trigger circuit 15-7, which may include a comparator for comparing the failed count 17 to a user-configurable threshold and a register in which to store the comparison results.

At the beginning of an iteration of the operation of LDPC decoder 7, parity check registers 15-4 in FIG. 4 are initialized with "0" s. Parallel QC-LDPC decoder 7 of FIG. 3 produces LLR updates for one block column (corresponding to Z variable nodes) of the QC-LDPC code at a time. Hard decision decoder 7-1 receives the sign bits of the Z log-likelihood ratios (LLRs) and provides them to BR*W barrel shifters 15-2, where Z is the submatrix size, BR is the number of block rows in the LDPC code, and W is the weight of each sub-matrix. The weight W is the number of variable node-to-check node "connections" or "intersections" within one row of a particular submatrix. Barrel shifters 15-2 ensure that the values output by exclusive OR circuit 15-3 are aligned with their corresponding parity checks. The hard decision values output by bit-wise exclusive OR circuit 15-3 are generated by exclusive ORing of the shifted LLR sign bits in shifter 15-2 with corresponding bits of parity check registers 15-4 which then are updated or replaced by the values output by bit-wise exclusive OR circuit 15-3. After all the block columns are processed, the parity check registers 15-4, contain the final results of the parity checks on bus 18. The "unsatisfied" check nodes OD correspond to "1" s in the parity check results, so "0" s in the parity check results correspond to "satisfied" check nodes. The parity check results $P\{BR*[Z-1:0]\}$ on bus 18 are provided as an input to post-processing control circuit 7-9.

In operation, hard decision decoder 7-10 looks at each row of parity check H matrix 1 of FIG. 1 to ensure that each row of H matrix 1 is satisfied, i.e., to ensure that the parity of each row of H matrix 1 should be "0". All of the parity checks are performed by the foregoing bit-wise exclusive OR operation. Specifically, in the bit-wise exclusive OR operations in block 15-3 of FIG. 4, corresponding bits of barrel shifters 15-2 and parity check registers 15-4 are exclusive ORed together to obtain a new result to put into parity check register 15-4. For one row of parity check H matrix 1 of FIG. 1, hard decision decoder 15-5 of FIG. 4 looks at the + or − sign bit of the LLR (Log-Likelihood Ratio) value that corresponds to an intersection of a sloped line in H matrix 1 with that row. The physical structure of the H matrix is stored as tables of shift values. In FIG. 3, the shift values are in the decoder control block 7-8. In FIG. 4 they are stored in the shift value generator 15-1. In the example of FIG. 2, when checking the parity of the first row, one of the bits that would be exclusive ORed is the sign (+ or −) of the value output by variable node VN[14] since it is "connected" to the first check node as indicated by the sloped line. Another value that is exclusive ORed corresponds to which ever variable node column is "connected" to the first check node in the next (i.e., adjacent) submatrix in H matrix 1.

In any submatrix there may be one, two, or more intersections of a particular row with various sloped lines, respectively, at which an intersection corresponds to a "1" in that row of that submatrix. For example, S0,0 in block 15-2 can refer to the first such intersection, and S0,1 can refer to the second such intersection in the same row. In effect, sign bits of the outputs of certain variable nodes, as defined by such "intersections", are exclusive ORed together to perform a parity check for that row, and the weight W is the number of such intersections within one row of the particular submatrix.

The shift value generation in block 15-1 of FIG. 4 for the parity check code is determined by the contents of the H matrix 1 of FIG. 1. For example, if a particular row of parity check H matrix 1 has shift values of 14 and 50, submatrix B might have different shift values of, for example, 75 and 150. (The shift value is the distance between the left edge of the particular submatrix and the first intersection or "1" in the 0th row of that submatrix.)

Hard decision decoder 7-1 supports various triggering criteria by means of check counter 15-6 which counts the number of failed parity checks and only triggers post-processing operation if the number of failed checks is lower than a certain threshold for a certain number of iterations. Both the threshold and number of iterations may be programmable. Specifically, parity check counter 15-6 counts the number of failed parity checks indicated by parity check registers 15-4 to determine how many parity checks have not been satisfied during the present iteration. If the number of unsatisfied parity checks exceeds the predetermined threshold value, then the post-processing operation is disabled. This is because the post-processing is effective only if there is a low number of, e.g., 10 or less, failed parity checks. A "1" in parity check registers 15-4 means the corresponding parity check failed, and parity check counter 15-6 counts the number of "1" in the parity check registers 15-4.

FIG. 5 shows a block diagram of a neighborhood identification circuit 21 which preferably is located in post-processing control circuit 7-9 of FIG. 3. Neighborhood identification circuit 21 includes a register 15-4 including the parity check results P{BR*[Z-1:0]} received from hard decision decoder 7-10 via bus 24B. The parity check results are applied via bus 18 to inputs of shifter circuitry 21-2. Shifter circuitry 21-2 includes hardware shifters $S_{0,0}$, $S_{0,2}$, ..., $S_{BR-1,W-1}$, where BR is the number of block columns in each parity check H matrix 1 and the weight W is the number of intersections within a row of the particular submatrix. Shifters $S_{0,0}$, $S_{0,2}$, ..., $S_{BR-1,W-1}$ are the same as or similar to those in hard decision decoder 7-10. The vector P{BR*[Z-1:0]} is applied to a group of barrel shifters 21-2 consisting of BR*W shifters in total. Each group of Z bits in the vector P{BR*[Z-1:0]} is applied to W shifters at the same time. For example, the vector P[Z-1:0] is applied by bus 18A as an input to shifters S0,0, S0,1 ... S0,W−1. Outputs of shifter circuitry 21-2 are applied as BR*W vectors of Z bits in width to inputs of bit-wise OR circuit 25. The output ND[Z-1:0] of OR circuit 25 is applied to a bus 27. The shift values are different for each block column, (i.e., the shift values are different for each submatrix). The input signal to shift value generator 23 indicates which block columns are being processed so that the correct shift values can be computed. (This is required for all shift value generators in the described embodiment.) The outputs of shift value generator 23 are connected to shifters $S_{0,0}$, $S_{0,2}$, ..., $S_{BR-1,W-1}$, respectively. Shift value generator 23 in FIG. 5 reverses the shifting performed by shift value generator 15-1 in FIG. 4.

In operation, neighborhood identification circuitry 21 in FIG. 5 determines which variable nodes ND are "connected" to (i.e., exchange messages with) unsatisfied check nodes OD. Note that the variable nodes which exchange messages with unsatisfied check nodes are sometimes referred to herein as "neighborhood variable nodes", Neighborhood identification circuitry 21 receives parity result vector P{BR*[Z-1:0]} from hard decision decoder 7-10. "1" s present in parity result vector P{BR*[Z-1:0]} denote which parity checks and corresponding check nodes are unsatisfied check nodes OD. Then, to determine which variable nodes are "connected" to unsatisfied check nodes OD, parity result vector P{BR*[Z-1:0]} is shifted according to the previously described shift values determined by parity check H matrix 1 in FIG. 1. In the output of a particular barrel shifter, "1" s denote variable nodes "connected" to unsatisfied check nodes OD. Since in the QC-LDPC code, a variable node VN can be "connected" to multiple check nodes, the outputs of all the shifters are ORed together. This means that if a variable node (column) is "connected" to any unsatisfied check node OD, that variable node column would be marked with a "1".

The output vector ND[Z-1:0] indicated in FIG. 5 also appears at the output of post-processing control circuit 7-9 in FIG. 3. The purpose of neighborhood identification circuit 21 is to find variable nodes that are "connected" to the unsatisfied parity checks. From parity check results vector P{BR*[Z-1:0]} of FIG. 4, neighborhood identification circuit 21 identifies which variable nodes are "connected" to the failed check nodes, again using the previously described shifting approach. Parity check results vector P{BR*[Z-1:0]} in block 21-1 of FIG. 5 is composed of "0" s and "1" s. A "1" means that the parity check failed, and the "1" s of parity check vector P{BR*[Z-1:0]} results vector are the bits of interest. The entire parity check results vector in block 21-1 is shifted appropriately according to whatever is defined in parity check H matrix 1 in FIG. 1. At the end of the shifting operations the vectors have been generated that identify which variable nodes are "connected" to check nodes that have failed parity checks. Then all of the outputs of shifters $S_{0,0}$, $S_{0,2}$, ..., $S_{BR-1,W-1}$ are logically ORed together by bit-wise OR gates 25, since each variable node connects to multiple check nodes. If any check node connected to a variable node has failed parity checks, the output vector ND[Z-1:0] will indicate that. (Shift value generator 23 in FIG. 5 generates different values than the one shown in FIG. 4, although the basic circuit structures are the same.)

FIG. 6 shows a block diagram of a message biasing circuit 29 which preferably is located in post-processing control circuit 7-9 of FIG. 3. Message biasing circuit 29 includes a barrel shifter 30 and message biasing circuitry 31. Barrel shifter circuit 30 receives the signal ND[Z-1:0] via bus 13 from postprocessing control circuit 7-9 of FIG. 3 and also receives a shift value via bus 30-1 from control logic either within the post-processing control circuit 7-9 of FIG. 3 or the decoder control circuit 7-8 of FIG. 3 Barrel shifter 30 produces the signal NCD[Z-1:0] on bus 30-2. The circuitry in block 31 performs processing of the ith entry NCD[i] in signal NCD. This circuitry is replicated Z times to process the entire signal NCD[Z-1:0]. Message biasing circuitry 29 includes AND circuitry 31-1, which receives the signal pp_en via bus 31-3, NCD[i] via bus 30-2 from barrel shifter 30, and the logical complement ~P[i] of P[i] via bus 31-4 from the parity check register output bus 18 in FIG. 4. The output of the AND function is 1 bit. Everything in block 31 is replicated to process all bits in NCD. The output of AND circuitry 31-1 is applied to the selection input of a multiplexer circuit 31-2. The "0" input of multiplexer circuit 31-2 receives an input signal, LLR[i], equal to the magnitude of the message sent to a check node from a "connected" variable node. Multiplexer circuit 31-2 receives another digital input signal L on its "1" input representing a biased message. The output of multiplexer circuit 31-2 is sent via parallel bus 32 to the check node processing circuit 7-3 of FIG. 3.

Message biasing circuit 29 may be thought of as being located in check node processors 7-3 in FIG. 3. First, in order to find check nodes "connected" to the variable nodes ND that are "connected" to unsatisfied check nodes CN, the incoming vector ND[Z-1:0] is again shifted, by means of barrel shifter 30 by appropriate shift amount specified by the value on bus 30-1. "1" s in the shifter output NCD[Z-1:0] on bus 30-2 include all of the check nodes "connected" to variable nodes ND. Out of these "connected" check nodes, it is necessary to select only those which have satisfied parity checks during the previous iteration. This information P{BR*[Z-1:0]} is available from parity check register output bus 18 of hard decision decoder 7-10, or alternatively, is available from post-processing control circuit 7-9 via bus 13. For each check node which is "connected" to variable node ND and also has satisfied the parity check in the previous iteration, the magnitude of the incoming variable-to-check message LLR[i] is overridden with a weaker message L, where L is a programmable value. (This output message is used in the same way as in regular check node processing.)

The duration of the noise injection or message biasing can be controlled via the pp_en signal applied by bus 31-3 to one input of AND gate 31-1 in FIG. 6 to enable or disable message biasing circuit 29. Also, the number of bursts of the noise injection or message biasing can be controlled by means of pp_en so multiple "shots" of perturbation/noise with different characteristics can be introduced to resolve more types of decoding errors due to different structures (for example, trapping set structures) in an LDPC code.

This message biasing includes injecting the previously mentioned noise or perturbations to break up the trapped error floor so as to improve the chances of LDPC decoder 7 (FIG. 3) operation converging to a valid codeword. The purpose of the message biasing is to inject noise or "bias messages" into a specific set of check nodes that satisfied the previously described priority check procedure and are "connected" to variable nodes that are "connected" to unsatisfied check nodes identified by neighborhood identification circuit 21 of FIG. 5. (In FIG. 5 the output ND[Z-1:0] on bus 27, which is part of bus 13 in FIG. 3, includes variable nodes ND that are "connected" to unsatisfied check nodes.) It is determined which check nodes are "connected" to those variable nodes ND, and they correspond to the output NCD[Z-1:0] of barrel shifter 30. Among those check nodes NCD[Z-1:0] of interest are the ones that have satisfied parity checks in the previous iteration.

The output of AND gate 31-1 in FIG. 6 indicates a number of check nodes of interest in barrel shifter output vector NCD [Z-1:0] for which the parity checks were satisfied, as indicated by the logical complement ~P[i] of P [i], where P[i] is the ith bit of the output signal P[Z-1:0] from post-processing control circuit 7-9. P[i] indicates whether the ith parity check is satisfied (P[i]=0 if the parity check is satisfied). The enable signal pp_en on bus 31-3 in FIG. 6 controls the duration T of the post-processing. Noise injection into the present check node corresponding to index "I" is enabled if all three inputs of AND gate 31-1 are "true". Then the bias message is input into that check node in check node processors 7-3 in FIG. 3 by means of multiplexer 31-2 in FIG. 6. If the select signal (output of AND gate 31-1) is 0, the original message |LLR[i]| is passed to the multiplexer inputs. No message biasing occurs. If the above-mentioned select signal is 1, a weakened message with smaller magnitude L is passed to the inputs. The digital signals "LLR[i]" and L are parallel signals, each signal represented by multiple bits. A larger value of L means the confidence is stronger. L only changes the magnitude of the message which indicates confidence. The sign of the confidence message is unchanged, and its algebraic sign indicates whether a bit in the codeword is believed to be 0 or 1. In other words, and decreased value of L indicates lower confidence that a particular codeword bit is either 0 or 1. Then the next iteration is performed wherein a bias value may or may not be injected into the message for the next check node to be processed.

FIG. 7 illustrates a LDPC decoder pipeline schedule 25 without the previously described post-processing according to the present invention. Each block in the schedule denotes a stage in the decoding process. The term "Rev Align" in group 35-one of FIG. 7 refers to a reverse alignment process performed by barrel shifter 7-2 in FIG. 3, whereby data from the variable nodes is aligned with the appropriate "connected" check nodes. The aligned data then is sent to the appropriate "connected" check nodes. The term "Align" in group 35-2 of FIG. 7 refers to the alignment process performed by barrel shifters 7-4 in FIG. 3, wherein, starting from the leftmost blocks in FIG. 7, messages from check node processors 7-3 in FIG. 3 are shifted by barrel shifters 7-4 and sent to the check nodes. In the stages labeled CN1, CN2 . . . CNi check node computations are performed by check node processors 7-3. After the "Align" and shift operations are performed by barrel shifters 7-4 in FIG. 3, the messages are sent back to the appropriate variable nodes. In stages VN1 . . . VNi computations are performed by the variable node processors 7-4 in FIG. 3. The end of the present decoding iteration occurs at the end of the VNi computation in the left block in group 35-4 of FIG. 7. The same process typically is repeated again several times.

FIG. 8 shows how post-processing in accordance with the present invention may fit into the "baseline" schedule indicated in FIG. 7. Sections 36-1 and 36-2 in FIG. 8 are the same as in FIG. 7. The variable node processing of the first batch of messages computes the values VN1 in section 36-2. Right after the first batch of variable node processing is complete, hard decision decoder 7-10 can begin to operate on these messages to update the parity check registers 15-4. This produces the results indicated by HD 1. The procedure is successively repeated, as indicated by VN2 . . . VNi, until all of the variable node processing is complete and the parity check registers all have been updated, as indicated by HDi in block 36-6. Then the neighborhood identification (as described above with reference to FIG. 5) is performed. After HDi in block 36-6, the unsatisfied parity checks have been determined, as indicated by "OD ready" in block 36-7, which refers to unsatisfied parity checks. This procedure is performed in batches, and produces the results CalcND1,2 . . . i following block 36-7. After the first batch of computations for ND are completed, the next stage can be started to determine which are the satisfied check nodes of interest SD.

The basic part 7A of LDPC decoder 7 operates on a group of variable nodes per clock cycle. Depending on how much hardware is desired to be included on a silicon chip, the described architecture can be scaled to handle multiple block columns or groups of variable nodes. More precisely, a block column contains Z variable nodes, where Z is the submatrix size. During post-processing hard decision decoder 7-10 (FIGS. 3 and 4) receives the basic variable node processing results generated by variable node processors 7-4 on bus 10 for the present group of variable nodes and updates the parity check results produced on bus 18, shown in FIG. 8 as HDx, where x=1, 2 . . . i). At the end of "i" iteration clock cycles (where i is equal to the number of groups of variable nodes in the H matrix), the parity check results are valid and are sent to the neighborhood identification module 21 of FIG. 5, as indicated by "OD ready" in block 36-7 of FIG. 8. Neighborhood identification module 21 also computes the "neighboring" VNs (variable nodes) in one group of variable nodes per clock cycle (shown as NDx, where x=1, 2 . . . i in group 36-7 of FIG. 8). SDx for a given group of variable nodes is computed one cycle after NDx is available. This information is used to bias messages in regular check node processing CN1,2, . . . i.

To determine which messages are to be biased is a several step process. First it is determined which checks are unsatisfied and that is indicated in OD ready block 36-7. Then it is determined which variable nodes are "connected" to those unsatisfied checks to produce ND1. The next step determines which check nodes are "connected" to the NDs which had parity checks satisfied to produce SD1. The result indicates which messages are to be biased. After the appropriate messages are biased, the check node processing is performed. The neighborhood identification indicated in section 36-3 can be repeated for several iterations, and this is accomplished in a pipeline manner after identification of one group of check nodes that should have messages biased. Then signal processing CN1 is started and at the same time the next group of bias targets SD2 is identified, and subsequently the signal processing CN2 is performed, and so forth until all the signal processing 36-4 is finished. Then the variable node processing is performed.

FIG. 9 is a block diagram illustrating details of the check node processors 7-3 of FIG. 3, wherein check nodes are abbreviated as CN, check node processing is abbreviated as CNP, and variable nodes are abbreviated as VN. In FIG. 9, check node processors 7-3 include a subtraction module 40-1 which receives the messages for check node processing via bus 32 in FIG. 6, and also receives messages via bus 40-11 from "previous iteration buffer" 40-8. Contents of the "current iteration buffer" are copied to the "previous iteration buffer" at the end of an iteration, after all variable node processing is complete. The results from subtraction module 40-1 are converted from 2's complement representation to sign-magnitude representation via a "2's complement to sign-magnitude and saturation" module 40-2. The output of "2's complement to sign-magnitude and saturation" module 40-2 is applied to one input of a controller module 40-3 which receives addresses of variable nodes currently sending messages to a check node or receiving messages from a check node from decoder control circuit 7-8 of FIG. 3 via bus 12. Controller 40-3 also receives information such as messages having the minimum and second minimum magnitude that were sent to this check node in the current iteration, the address of the variable node that sent the minimum-magnitude message, and the signs of all incoming messages to this check node via bus 40-12 from "current iteration buffer" 40-9. Controller 40-3 computes updated information on the minimum, second minimum, etc. based on the current incoming message from bus 32 and sends buffer update information to current iteration buffer 40-9 via bus 40-13. For example, if the current incoming message has a magnitude smaller than the minimum stored in current iteration buffer 40-9, then the magnitude of the current incoming message and the address of the variable node which sent this message will overwrite the previous values stored in current iteration buffer 40-9.

Current iteration buffer 40-9 includes a comparator and scaling module 40-10. Current iteration buffer 40-9 also includes a set of registers storing the minimum (min1) and second minimum (min2) magnitudes of messages that were sent to this check node, the address of the variable node that sent the minimum-magnitude message (pos1), the XOR (exclusive OR) of the signs of all incoming messages (totsgn), and the signs of all incoming messages (sgnarray). An output of a register 40-21 in current iteration buffer 40-9 sends a copy of the entire contents of register 40-21 to previous iteration buffer 40-8 via bus 40-15. The output of controller 40-3 is converted from sign magnitude representation back to 2's complement via a sign magnitude to 2's complement module 40-4 which also receives all the information contained in register 40-21 from current iteration buffer 40-9 via bus 40-14. This is necessary to compute outgoing messages to be sent from this check node to its "connected" variable nodes. Likewise, information contained in previous iteration buffer 40-8 are sent to sign-magnitude to 2's complement module 42, to be converted from sign-magnitude form to 2's complement. 2's complement output values from sign-magnitude to 2's complement modules 40-4 and 42 are applied to the inputs of a subtraction module 40-5. The resulting difference forms the message to be sent from the check node to a "connected" variable node.

LLRs from one or more variable nodes are received from message biasing circuit 29 of FIG. 6 via bus 32 after undergoing message biasing if needed. First, the LLR must be subtracted by the message from the previous iteration, which was sent from the subject check node to the variable node that originated the current LLR on bus 32. Block 40-1 performs this subtraction. As indicated by block 40-2, the result from block 40-1 result is received and operated upon by a 2's complement generator and is converted from 2's complement format to sign-magnitude format. The magnitude is represented as a fixed point number with a fixed number of bits. Therefore, if the desired magnitude exceeds the maximum value that can be represented by this fixed number of bits, the magnitude is "saturated" to this maximum value instead.

Controller 40-3 in FIG. 9 receives from decoder control circuit 7-8 of FIG. 3 the addresses of variable nodes currently sending message to the current check node or receiving messages from the check node. Controller 40-3 works with the comparator and scaling circuit 40-10 in local "current iteration" buffer 40-9 to find the two messages having the smallest magnitudes, out of all messages received by the subject check node in the current iteration. The messages are received over multiple clock cycles, so every time new messages are received they are compared by means of comparator 40-10 with the present minimum magnitude messages in the local buffer 40-9. If the new messages are smaller in magnitude than either min1 or min2, respectively, then min1 and/or min2 in the local buffer 40-9 is updated.

Local "current iteration" buffer 40-9 also stores the position or address of the variable node which originated the message with smallest magnitude (pos1), the signs of all messages, and the combined sign of all messages (i.e. multiplying the signs of all messages, which is needed for correct execution of the algorithm because a message sent from the check node back to a specific variable node must disregard information (magnitude and sign) sent from that variable node.) An optional scale factor may be applied to that magnitude. After all of the 16 messages (in this example) are processed, local current iteration buffer 40-9 contains the two messages with the minimum magnitudes. The process then proceeds to the output phase associated with the output of subtraction module 40-5 to send results back to the message-originating variable nodes. In the output phase, controller 40-3 uses information in current iteration buffer 40-9 and converts messages back to a format suitable for a specific variable node by converting sign-magnitude information stored in the current iteration buffer back to 2's complement format. From this, it subtracts the previous message sent to this variable node in the previous iteration (from previous iteration buffer 40-8. The resulting message is sent to the variable node by means of barrel shifter 7-4 in FIG. 3. After messages to all variable nodes are computed and sent out, the current iteration buffer contents are copied to the previous iteration buffer 40-8, for use in the next iteration.

Thus, in a single decoding iteration, a variable node sends messages to "connected" check nodes, and a check node collects messages from multiple "connected" variable nodes, over several iterations (i.e., several clock cycles). The check node computes and sends messages back to the variable nodes "connected" to it, and a variable node updates its LLR value based on messages received from check nodes. Decoding iterations are repeated several times. For example, in each iteration, if the check node collects 16 messages from variable nodes, this occurs over multiple clock cycles.

Figure 10:
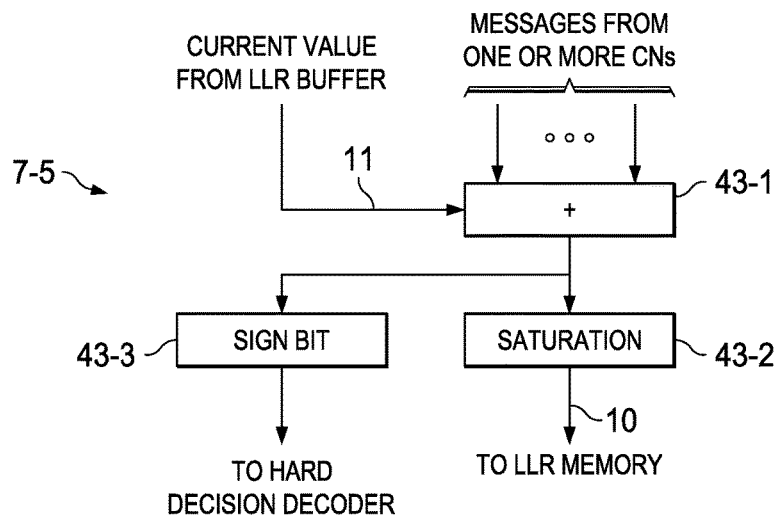
FIG. 10 is a block diagram useful in describing the structure and operation of the variable node processors in block 7-5 of FIG. 3.
Figure 11:
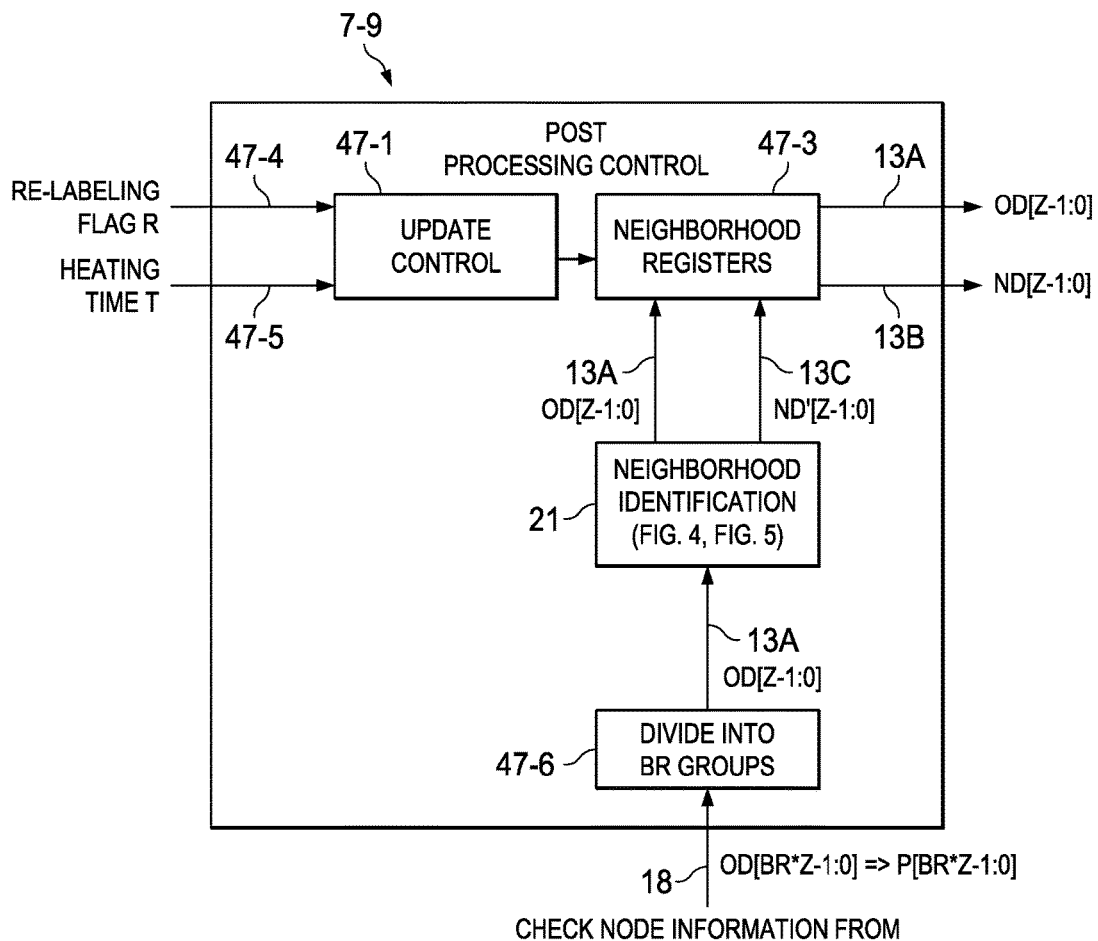
FIG. 11 is a block diagram useful in describing the operations of post-processing control system block 7-9 of FIG. 3.

FIG. 10 is a block diagram of the variable node processors in block 7-5 of FIG. 3. Variable node processors 7-5 include an adder 43-1 which receives messages from one or more check nodes via the output buses of barrel shifters 7-4, as also generally indicated in FIG. 3. Adder 43-1 also receives the current value from LLR buffer 7-1 via bus 11 in FIG. 3. The output of adder 43-1 is provided as an input to sign bit circuit 43-3 and saturation module 43-2. The output of sign bit 43-3 is coupled to the inputs of barrel shifters 15-2 of hard decision decoder 7-10 in FIG. 4. The output of saturation module 43-2 is coupled by bus 10 to transmit updated LLR information for the current time frame to an input of LLR buffer 7-1 in FIG. 3. The variable node processing simply sums messages received from all "connected" check nodes, then adds the sum to the current value stored in the LLR buffer 7-1 of FIG. 3. The result is the updated LLR and is written back, as indicated by arrow 14 in FIG. 3, to LLR buffer 7-1. The sign bit of the updated LLR value is used in hard decision decoder 7-10.

FIG. 11 is a block diagram of the operations performed by post-processing control system 7-9 of FIG. 3. Post-processing control system 7-9 includes an update control module 41-1 which receives a "re-labeling" flag R via bus 47-4 and a "heating time" T value via bus 47-5. Relabeling determines the check nodes receiving noise injection. In the described embodiment of the invention, relabeling can be performed multiple times such that noise can be injected into different check nodes each time. This helps resolves more decoding errors. Heating time T refers to the number of consecutive iterations over which noise is injected. Some decoding errors can be resolved after one iteration of noise injection, but others require more iterations. Hence, the post-processing control system 7-9 allows different heating times (Ts) to be specified to resolve more decoding errors. The output of update control module 47-1 in FIG. 11 is applied to an input of neighborhood registers 47-3. Neighborhood registers 47-3 receive from neighborhood identification module 47-2 the digital signals OD[Z-1:0] on bus 13A and ND'[Z-1:0] on bus 13C and generate output signals OD[Z-1:0] on bus 13A and ND[Z-1:0] on bus 13B. Neighborhood registers 47-3 may or may not be updated with the most recent outputs of neighborhood identification module 21 depending on the value of the above-mentioned re-labeling flag "R". Therefore, ND[Z-1:0] on bus 13B may be identical to ND'[Z-1:0] or may be equal to a previous value of ND'[Z-1:0] depending on the re-labeling flag "R". A "Divide into BR groups" module 47-6 receives the check node information signal OD{BR*[Z-1:0]} from hard decision decoder 7-10 of FIG. 4 via bus 18 and in response divides them into blocks of Z bits, and sends one block at a time as signal OD[Z-1:0] on bus 13A at the output of neighborhood registers module 47-3 and provides it as an input to neighborhood identification module 47-2.

Post-processing control block 7-9 in FIG. 3 basically takes the check node information from hard decision decoder 7-10 and checks to determine if the number X of unsatisfied checks is below a certain threshold. If X is above the threshold post-processing control circuit 7-9 does nothing, but otherwise it sends enable signals to neighborhood identification module 47-2 in FIGS. 5 and 11 as well as neighboring variable nodes (of unsatisfied checks). It also takes relabeling flag (R), heating time (T) and heating magnitude (L) as inputs, to properly set the noise injection locations, time and strength, respectively.

The described post-processing hardware 7B (FIG. 3) implements real-time message biasing. It introduces a perturbation effect, or in other words, injects noise in the decoding process to break the local optima caused by trapping set errors. Trapping set errors is generally the dominant contributor to error floors in LDPC codes. As previously indicated, the prior art in post-processing hardware only injects noise once (single-shot noise injection) in the decoding process and only allows changing magnitude of the noise, whereas the proposed solution supports additional flexibility in noise injection as follows. First, the post-processing hardware can inject noise of different magnitude and duration, as indicated by T in FIG. 11, over multiple iterations. This allows resolving errors caused by different types of trapping set structures that a single noise injection alone cannot resolve. Second, the proposed hardware performs neighborhood relabeling (i.e. dynamically change the locations of noise injection), as indicated by R in FIG. 11. This affects a bigger set of nodes in the LDPC code structure. Third, the proposed hardware has a mechanism to trigger post-processing only upon detection of a trapping set error. This means that when the decoder is decoding frames that do not require post-processing, there is no latency penalty.

It should be understood that the additional pipeline delays for neighborhood identification is only necessary if (1) post-processing is triggered; (2) the current iteration requires noise injection; and (3) either it is the first iteration of noise injection or relabeling is enabled. Post-processing should be triggered relatively infrequently since it is only used in the error floor region where the BER is low. Therefore, the extra pipeline delays should have negligible impact on the average decoder throughput.

The post-processing hardware supports different parameters in the post-processing algorithm, including (1) the criteria for triggering noise injection, (2) the duration (T) of noise injection, (3) whether or not relabeling (R) occurs, i.e., whether neighborhood identification (ND) is updated during noise injection, (4) the strength or magnitude of message biasing L, and (5) the number of times noise is injected. The hardware performs "hard decision decoding" and "neighborhood identification" in an efficient manner that is compatible with a parallel quasi-cyclic (QC) LDPC decoder. Specifically, "neighborhood identification" is done efficiently with operations through barrel shifters. Both "hard decision decoding" and "neighborhood identification" operations are tightly integrated into the main LDPC decoder pipeline schedule—after the main LDPC decoder completes processing one block of messages, "hard decision decoding" and "neighborhood identification" operate on the results in a pipelined manner.

The described post-processing hardware embodiments which support multi-shot noise injection can resolve up to 90% of trapping set errors, while single-shot noise injection only resolves 60-70% of trapping set errors. The proposed hardware architecture and pipeline schedule are optimized for column-based high throughput LDPC decoders for quasi-cyclic LDPC codes. Furthermore, there is no latency penalty when decoding frames that do not require post-processing.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, it should be understood that it is not essential to have a hard decision decoder to calculate the decoded outputs. However, hard decision decoder 7-10 is used to check the decoded outputs to determine if all of the parity checks are satisfied. For example, in some cases the perturbations may be introduced to effectively resolve decoding errors that are not due to trapping sets.

What is claimed is:

1. Post-processing circuitry for LDPC (Low Density Parity Check) decoding, comprising:
    (a) check node processor circuitry for receiving and processing LLR (Log-Likelihood Ratio) values;
    (b) hard decision decoder circuitry for receiving processed LLR information that may have been modified by the check node processor circuitry and performing parity check operations on the received and processed LLR information;
    (c) post-processing control circuitry coupled to the check node processor circuitry for controlling updating of LLR information in the check node processor circuitry in response to parity check decisions by the hard decision decoder, and wherein the check node processor circuitry, hard decision decoder circuitry, and post-processing control circuitry cooperate to identify check nodes whose parity checks are unsatisfied after an iteration of the post-processing circuitry, identify neighborhood variable nodes that exchange messages with check nodes which are unsatisfied after an iteration of the decoding and post-processing circuitry, identify satisfied check nodes which exchange messages with neighborhood variable nodes, and modify messages from neighborhood variable nodes to satisfied check nodes to a new value if needed to introduce perturbations that effectively resolve decoding errors and improve bit error rate performance of the LDPC decoding;
    (d) post-processing control circuitry that allows the set of neighborhood variable nodes to be optionally updated during post-processing; and
    (e) neighborhood identification circuitry associated with the hard decision decoder circuitry and the post-processing control circuitry for determining which variable nodes of a parity check matrix are connected with unsatisfied check nodes of the parity check matrix wherein the unsatisfied check nodes have failed a parity check, and producing a first signal that indicates which variable nodes are connected to unsatisfied check nodes.

2. The post-processing circuitry of claim 1 wherein the shifted LLR values are generated by first shifter circuitry which receives initial LLR values from an LLR buffer, and wherein contents of the check node processor circuitry are output to second shifter circuitry, wherein information shifted by the second shifter circuitry is re-aligned relative to the initial LLR values and then input to variable node processor circuitry, wherein information processed by the variable node processor circuitry is provided as an updated input to the hard decision decoder and to an updated LLR input of the LLR buffer, and wherein the first and second shifter circuitry, the check node processor circuitry and the variable node processor circuitry are controlled by post-processing controller circuitry so as to cause the check node processor circuitry to modify LLR information therein according to parity check decisions of the hard decision decoder.

3. The post-processing circuitry of claim 1 wherein the post-processing control circuitry includes message biasing circuitry for introducing the perturbations, wherein the message biasing circuitry includes circuitry for introducing multiple perturbations of differing characteristics during a particular iteration cycle to resolve more types of decoding errors due to different trapping set structures in an LDPC code.

4. The post-processing circuitry of claim 1 wherein the post-processing control circuitry includes message biasing circuitry for introducing the perturbations, wherein the message biasing circuitry includes circuitry for controlling duration of a perturbation during a particular iteration cycle.

5. The post-processing circuitry of claim 1 wherein the post-processing control circuitry includes message biasing circuitry including (1) shifting circuitry for shifting the first signal by a shift value determined by the parity check matrix to produce a second signal that indicates all of the check nodes which are connected to neighborhood variable nodes, and (2) satisfied check nodes selecting circuitry for receiving the second signal and operating to select check nodes which have satisfied parity checks during a prior iteration cycle of the hard decision decoder circuitry.

6. The post-processing circuitry of claim 2 wherein the hard decision decoder includes third shifter circuitry receiving the processed LLR information, shift value generator circuitry for generating shift values to be provided as inputs to the third shifter circuitry, bit-wise exclusive OR circuitry for performing parity checks corresponding to bits of the parity check matrix, respectively, and parity check register circuitry having inputs coupled to corresponding outputs of the bit-wise exclusive OR circuitry, the parity check register circuitry receiving parity check results from the bit-wise exclusive OR circuitry.

7. The post-processing circuitry of claim 6 wherein the bit-wise exclusive OR circuitry includes exclusive OR circuits each having a first input coupled to an output of a corresponding bit of the third shifter circuitry, respectively, and a second input coupled to an output of a corresponding bit of the parity check register circuitry, respectively, for performing bit-wise parity check operations associated with corresponding bits of the parity check matrix.

8. The post-processing circuitry of claim 6 wherein the hard decision decoder includes parity check counter circuitry coupled to an output of the parity check register circuitry for counting parity check failures, and post-processing trigger circuitry coupled to the parity check counter circuitry for disabling post-processing if the number of failures indicated by the parity check counter circuitry exceeds a predetermined value.

9. The post-processing circuitry of claim 6 wherein the hard decision decoder, the exclusive bit-wise OR circuitry and the third shifter circuitry cooperate to align hard decision values output by the variable node processor circuitry with corresponding parity check bits of the parity check register circuitry.

10. The post-processing circuitry of claim 6 including shift value generator circuitry generating shift values as inputs to fourth shifter circuitry to reverse shifting performed in response to the shift value generator circuitry.

11. The post-processing circuitry of claim 1 wherein the decoding errors are due to trapping sets.

* * * * *